US007124385B2

(12) United States Patent
McGuinness et al.

(10) Patent No.: US 7,124,385 B2
(45) Date of Patent: Oct. 17, 2006

(54) METHOD FOR AUTOMATED TRANSISTOR FOLDING

(75) Inventors: Patrick James McGuinness, Austin, TX (US); Robert Lee Maziasz, Austin, TX (US); Andrei Vladimirovitch Zinchenko, Moscow (RU); Vladimir Pavlovich Rozenfeld, Moscow Region (RU); Michael Viacheslavovich Golikov, Moscow (RU); Alexander Mikhailovich Marchenko, Moscow (RU)

(73) Assignee: Freescale Semiconductor, Inc., Austin, TX (US)

( * ) Notice: Subject to any disclaimer, the term of this patent is extended or adjusted under 35 U.S.C. 154(b) by 248 days.

(21) Appl. No.: 10/657,609

(22) Filed: Sep. 8, 2003

(65) Prior Publication Data
US 2004/0078768 A1 Apr. 22, 2004

(30) Foreign Application Priority Data
Sep. 20, 2002 (RU) ............... PCT/RU02/00430

(51) Int. Cl.
G06F 9/45 (2006.01)
G06F 17/50 (2006.01)
(52) U.S. Cl. ............... 716/9; 716/2; 716/3; 716/8; 716/11
(58) Field of Classification Search ............... 716/2, 716/8–12, 3; 326/10, 41, 47; 703/1
See application file for complete search history.

(56) References Cited

U.S. PATENT DOCUMENTS

| 5,675,501 | A | * | 10/1997 | Aoki ............... 716/8 |
| 5,984,510 | A | | 11/1999 | Guruswamy et al. |
| 5,995,734 | A | * | 11/1999 | Saika ............... 716/9 |
| 6,163,877 | A | * | 12/2000 | Gupta ............... 716/8 |
| 6,209,123 | B1 | * | 3/2001 | Maziasz et al. ............... 716/14 |
| 6,332,215 | B1 | | 12/2001 | Patel et al. |
| 6,351,841 | B1 | * | 2/2002 | Tickle ............... 716/8 |
| 6,393,601 | B1 | | 5/2002 | Tanaka et al. |
| 6,415,417 | B1 | * | 7/2002 | Tanaka et al. ............... 716/2 |

FOREIGN PATENT DOCUMENTS

| EP | 1 037 145 A2 | 11/1999 |
| RU | 2 137 295 C1 | 9/1999 |
| WO | WO 01/75687 A1 | 10/2001 |

OTHER PUBLICATIONS

Chou et al., A Multiple-row transistor placement system for full custom design, Apr. 2005, IEEE, pp. 136-139.*
Whaley, John; "Partial Method Compilation using Dynamic Profile Information"; OOPSLA 01; 2001; pp. 166-179; ACM.
Gupta, Avaneendra; "Optimal 2-D Cell Layout with Integrated Transistor Folding"; ICCAD98; 1998; pp. 128-135; ACM.

(Continued)

*Primary Examiner*—Vuthe Siek
*Assistant Examiner*—Nghia M. Doan

(57) ABSTRACT

A method for generating an integrated circuit layout is disclosed. One embodiment includes receiving an integrated circuit netlist describing a plurality of transistors and a plurality of conductors for interconnecting the plurality of transistors, each of the plurality of transistors having a width in a layout corresponding to the integrated circuit netlist. More than one of the plurality of transistors are determined to be the widest transistors, all having the same width. One of the widest transistors is folded to produce a folded transistor that is electrically equivalent to the widest transistor. The folded transistor has at least two fingers, each finger having a smaller width than the width of the widest transistors. A fold solution for the layout having the one folded transistor is created.

17 Claims, 12 Drawing Sheets

OTHER PUBLICATIONS

Author Unknown; IBM Java™ 2 Implementations on Intel Architecture.

Author Unknown "IBM Rewrites the Book on Java™ Performance".

* cited by examiner

FIG. 1 —PRIOR ART—

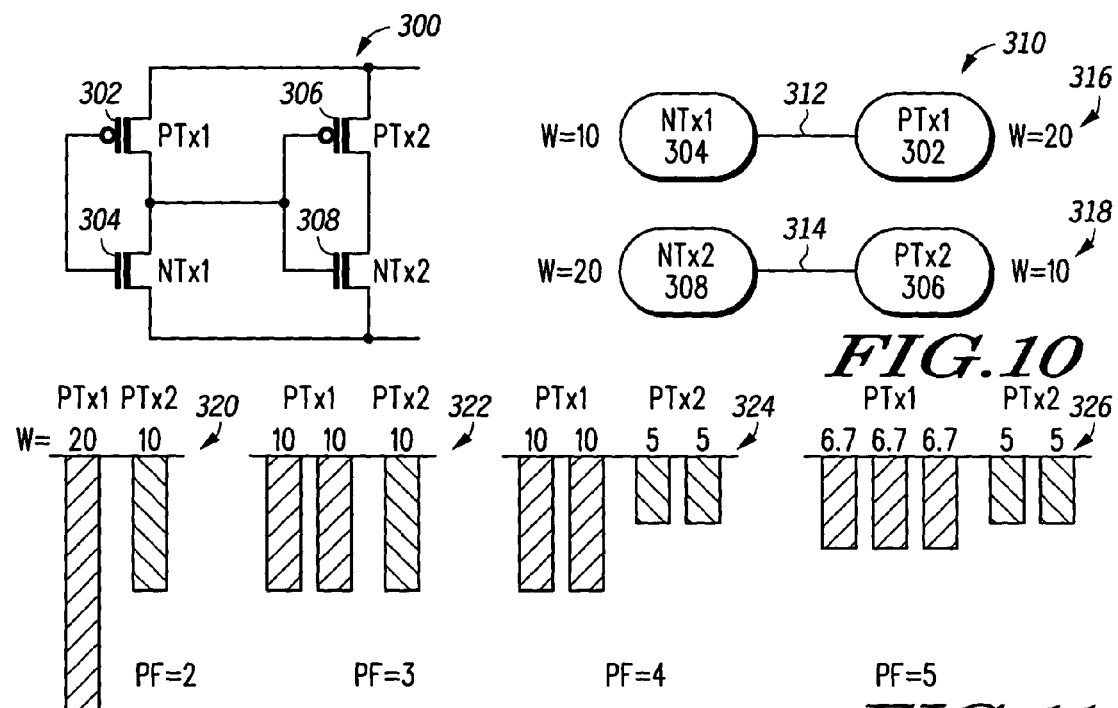
FIG.10
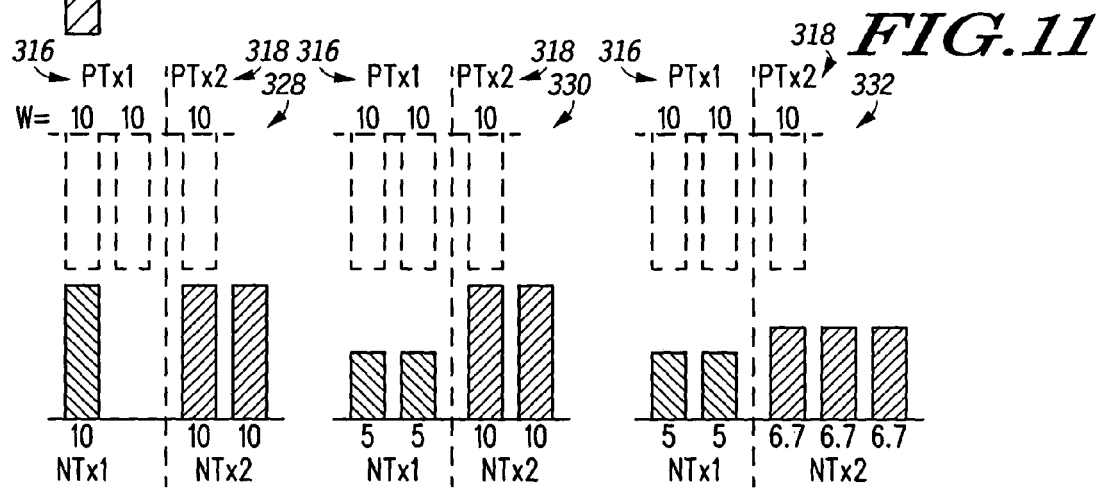
FIG.11
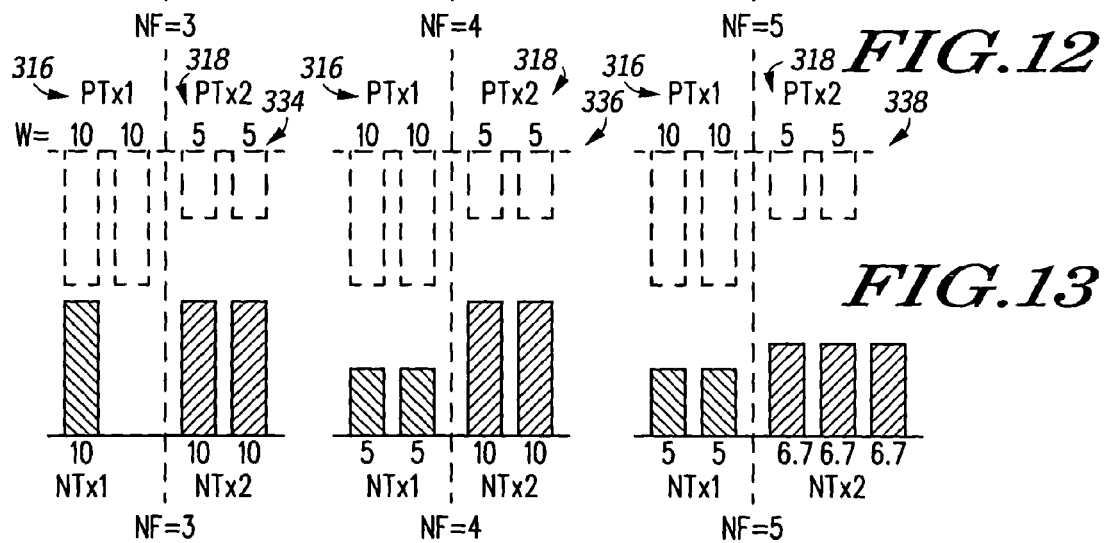
FIG.12
FIG.13

METHOD FOR AUTOMATED TRANSISTOR FOLDING

FIELD OF THE INVENTION

The invention relates generally to the design and manufacture of integrated circuits, and more particularly, to a method and apparatus for producing cell structures.

RELATED ART

A common method of designing an integrated circuit in a semiconductor design requires that an integrated circuit designer first provide a library of computer stored circuit cells and a behavioral circuit model describing the functionality of the integrated circuit. These circuit cells typically include fundamental logic gates such as OR, NAND, NOR, AND, XOR, inverter, and like logical cells with an array of logic gate sizes. These cells also include sequential circuit elements such as latches and flip-flops for memory requirements. A circuit designer determines which particular cells are needed for the integrated circuit, and once the required circuit cells are determined, the integrated circuit designer creates or retrieves a base logical cell structure for each cell type. Each base logical cell structure contains logical representations of transistors and other cell elements required to perform the particular logic functions of the cell. The base logical cell structure includes two-dimensional geometric data representing dimensions of the transistors and structures.

The base logical cell structures are used to created physical cell structures. That is, the integrated circuit designer determines physical placement of transistors and other cell elements within each logical cell structure and determines conductive routing between the transistors and elements to form the required logic gates. The designer must place transistors and other components within each cell's physical structure such that the cell adheres to a library cell height constraint and operation constraints. A cell height constraint generally refers to a maximum allowable height of cell structures for the particular integrated circuit design. Thus, the cell height constraint may also be referred to as a standard cell height. Because in further steps, cells will be assembled in rows to create an integrated circuit, the cells that are assembled in rows between power and ground rails must have equal cell heights. To meet the library height constraint, an IC designer often folds transistors within the base cell structure to create a cell structure having a shorter cell height to satisfy the library height constraint.

As is known in the art, the folding of transistors and other cell elements includes dividing the elements into at least two sections. In a CMOS design, for example, an unfolded transistor may be replaced by two or more small transistors that, connected correctly in combination, provide an equivalent current drive. When a transistor is replaced by the two or more smaller transistors, the transistor is considered to have been folded. With each of the folded transistor portions shorter than the unfolded transistor, the folded transistor portions may be arranged within the cell structure to create a cell structure having the shorter height.

For example, FIG. 1 illustrates an unfolded transistor 10 having a polysilicon region 14 (corresponding to the gate of transistor 10), diffusion region 16, and source/drain contacts 12 and 18. Transistor 10 has a width W defined as the distance along polysilicon region 14 overlapping diffusion region 16, as shown in FIG. 1. Therefore, W is considered the transistor width. Transistor 10 can be folded into multiple transistors called fingers. For example, as illustrated in FIG. 1, transistor 10 can be folded to create transistors 27 and 29 (also referred to as fingers 27 and 29), where each finger includes a portion of polysilicon region 28 and diffusion region 24, which are "folded" versions of polysilicon region 14 and diffusion region 16. Transistors 27 and 29 also share source/drain contacts 22 and 26. Note that the width of transistor 27 and 29 is now approximately W/2, i.e. approximately half of the width of unfolded transistor 10. In the example of FIG. 1, it can be said that unfolded transistor 10 is folded once to produce two fingers (transistors 27 and 29); therefore, a transistor folded N times generally results in N+1 fingers.

The circuit designer, with experience, manually provides a rough estimation of a satisfactory cell layout and folding combination based on the library height constraint. However, the designer can evaluate only a few folding combinations within the cell structure. Therefore, the quality of the physical cell structure layout depends upon the IC designer's ability and the amount of time and effort the circuit designer devotes to the physical layout of the cell.

Because typical cell structures may include hundreds of transistors, the possible folding combinations to yield a desired cell height are many. Therefore, prior art methods have failed to generate sufficient possible folds. Furthermore, the organization of folded transistors and other components within the cell structure is also great. Because the overall area of an integrated circuit constructed using the cells depends upon the standard cell height as well as the total widths of the cells, the optimization of cell width is extremely important. Currently, an integrated circuit designer's experience to fold transistors is relied upon and an optimized cell layout is seldom achieved. Without optimized cells, integrated circuits created with the non-optimized cells are also not optimized, thus increasing the size and cost of integrated circuits. Increased size of integrated circuits also results in increased heat generation and reduced speed. Therefore, a need exists for an apparatus and method for improved transistor folding in order to create optimized cells structures.

SUMMARY OF THE INVENTION

A method for generating an integrated circuit layout is disclosed. One embodiment includes receiving an integrated circuit netlist describing a plurality of transistors and a plurality of conductors for interconnecting the plurality of transistors, each of the plurality of transistors having a width in a layout corresponding to the integrated circuit netlist. More than one of the plurality of transistors are determined to be the widest transistors, all having the same width. One of the widest transistors is folded to produce a folded transistor that is electrically equivalent to the widest transistor. The folded transistor has at least two fingers, each finger having a smaller width than the width of the widest transistors. A fold solution for the layout having the one folded transistor is created.

BRIEF DESCRIPTION OF THE DRAWINGS

The present invention is illustrated by way of example and not limited by the accompanying figures, in which like references indicate similar elements, and in which:

FIG. 10 illustrates a transistor circuit and a corresponding dependency map in accordance with one embodiment of the present invention;

FIGS. 11–13 illustrate transistor foldings in accordance with embodiments of the present invention;

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

As described above, transistor folding is the process of splitting a transistor in a netlist into multiple transistors called fingers. The folded netlist is electrically equivalent but structurally distinct with a different number or configuration of transistors or connections. Transistor folding can therefore be used in layout synthesis to create a more suitable layout while maintaining equivalent electrical behavior.

Figure 2:
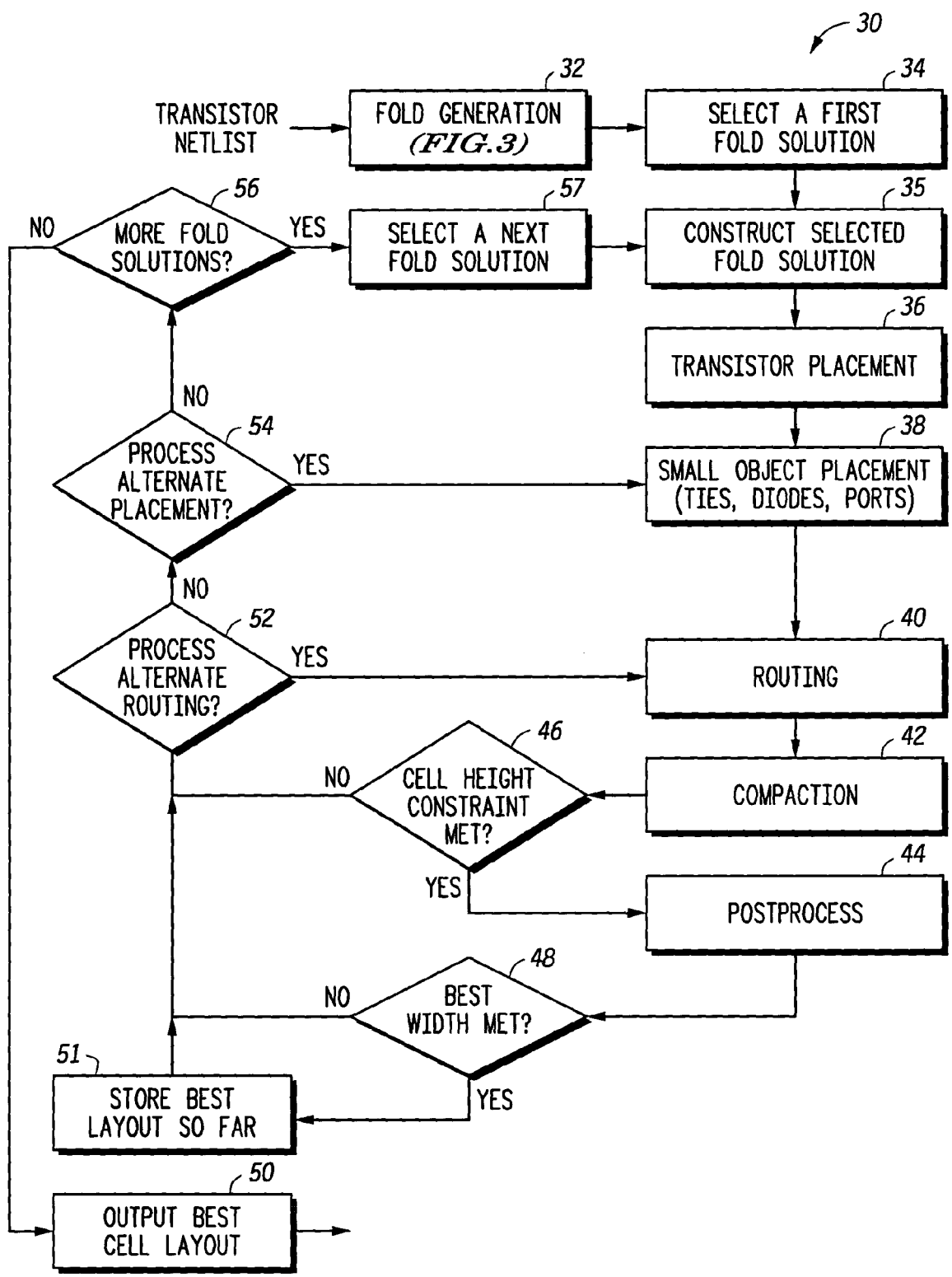
FIG. 2 illustrates, in flow diagram form, a method for generating a cell layout in accordance with one embodiment of the present invention.

FIG. 2 illustrates a flow 30 corresponding to a method of generating a cell layout. In block 32 (which will be described in more detail below in reference to FIG. 3), fold generation based on a received transistor netlist is performed. In this block, different transistor foldings are generating, measured, and sorted to create a sorted final fold solution list. Note that the transistor netlist may correspond to a single logical cell, multiple logical cells, or a portion of a logical cell. This sorted final fold solution list is then used to determine which fold solution generates an optimized cell layout. Note that in alternate embodiments, as will be described in more detail with reference to FIG. 3, the sorted final fold solution list may be sorted based on a variety of different parameters. Alternatively, the final fold solution list created in block 32 may not be sorted into any particular order. In the example described herein, it will be assumed that the sorted final fold solution list is sorted by increasing width lower bound (WLB) estimates (which will be described in more detail below in reference to FIG. 3).

Flow proceeds to block 34 where a first fold solution is selected from the sorted final fold solution list. Note that in one embodiment, the fold solutions are selected in order from the sorted final fold solution list meaning that the fold solution with the smallest WLB estimate is selected first. Flow proceeds to block 35 where the selected fold solution is constructed. This includes creating the data structure or data structures which define the selected fold solution. Flow proceeds to block 36 where the transistors of the netlist (containing the resulting transistors of the selected folding) is placed in an appropriate location. In block 38, small objects (such as ties, diodes, and ports) are also placed. In block 40, routing is performed where each of the components is connected to one another. A resulting layout is subsequently compacted in block 42. It is then determined, at decision diamond 46, whether or not the height of the resulting layout meets a cell height constraint. (This cell height constraint may refer to a maximum allowable cell height, such as, for example, the standard cell height described above or any other imposed cell height constraint.) If the cell height constraint is not met, the layout is unsuitable for use, and an alternate layout must be determined. Therefore, if, at decision diamond 46, the cell height constraint is not met, flow proceeds to decision diamond 52 where it is determined whether there is alternate routing that may be processed which can result in a lower height. If there is, flow returns to block 40 where the new routing for the layout is attempted, the layout is compacted, and the layout height is compared to the cell height constraint (e.g. the standard cell height, in one embodiment).

If, at decision diamond 52, it is determined that there is no alternate routing, flow proceeds to decision diamond 54 where it is determined whether an alternate object placement is available. If so, the alternate placement is processed, and flow returns to block 38, where flow continues as described above. If there is no alternate routing and no alternate placement available, flow proceeds from decision diamond 54 to decision diamond 56 where it is determined whether more fold solutions exist within the sorted final fold solution list. If so, a next fold solution is selected from the sorted final fold solution list in block 57 and flow repeats beginning at block 35, where a new resulting layout using the next fold solution is compared against the cell height constraint (at decision diamond 46). If no more fold solutions exist, flow proceeds to block 50 where a final cell layout, corresponding to the fold solution that produced the best layout, is output as the best cell layout.

If, at decision diamond 46, the cell height constraint is met, flow proceeds to block 44 where the layout is postprocessed to remove notches and enhance circuit performance. Flow proceeds to decision diamond 48 where it is determined whether the best cell width is met. Note that in the current embodiment, since the fold solutions are selected in order from the sorted final fold solution list, the currently selected fold solution corresponds to the cell layout which meets the cell height constraint and is also expected to have the smallest cell width (assuming the WLB estimates provided the correct ordering of the fold solutions). In decision diamond 48, whether the best width is met is determined by comparing the resulting cell width with the WLB estimate of the subsequent fold solution. If it is less than or equal to the WLB of the next fold solution, then the best width is met and flow proceeds to block 51 where the cell layout corresponding to the current fold solution is stored as the best layout so far, thus overwriting any previously stored cell layout.

Therefore, the best solution "so far" is continuously stored each time a best width is met at decision diamond 48. If, however, the resulting cell width is greater than the WLB of the next fold solution, then flow proceeds to decision diamond 52 as described above, where different routing, different small object placement, or a different fold solution may be attempted. Note that if the best width is not met, the cell layout is not stored. Therefore, in block 50, after all fold solutions have been selected and processed, the currently stored cell layout (i.e. the cell layout most recently stored in block 51) is output as the best cell layout, thus resulting in a physical layout which meets the cell height constraint while having the smallest cell width.

Therefore, with flow 30 of FIG. 2, each fold solution from the sorted final fold solution list is selected and used in turn to generate a possible layout until an optimized fold solution is determined for use in generating a final optimized cell layout. Note that alternate embodiments may select the best cell layout using one or more parameters other than cell width. Therefore, a different comparison or comparisons may be used in decision diamond 48 for determining whether to generate and store the current cell layout as the best layout so far.

The sequence of selecting fold solutions from the final fold solution list (i.e. block 34 of FIG. 2) can also be flexible. For example, in order to find a best solution (corresponding to the flow of FIG. 2), the fold solutions can be sorted by increasing WLB estimates and sequentially evaluated until the cell height constraint is met and the smallest cell width of the resulting layout is smaller than the WLB or until all fold solutions have been tried or until no improvement is achieved after a user-specified number of fold solutions are evaluated. Alternatively, the final fold solution list can be ordered according to other parameters instead of or in addition to width. An alternate embodiment may sequentially evaluate the fold solutions until the cell height constraint is met or after all folding solutions have been tried, without determining whether the best cell width is met. Alternatively, a fast solution can be obtained by sequentially evaluating the fold solutions, and for each fold solution evaluated, if the cell height of the resulting layout is larger than the HLB estimate, the HLB estimate for all subsequent fold solutions is adjusted to account for the height error difference by adding to the HLB the average amount of the HLB error to actual height (by some adjustment ratio between 0.5 and 1 of the actual difference). Therefore, all fold solutions which fail to meet the cell height constraint under the adjusted HLB estimates are eliminated from consideration, thus possibly reducing the number of fold solutions needing to be evaluated. Processing continues until the cell height constraint is met or until all folding solutions have been tried.

Figure 3:
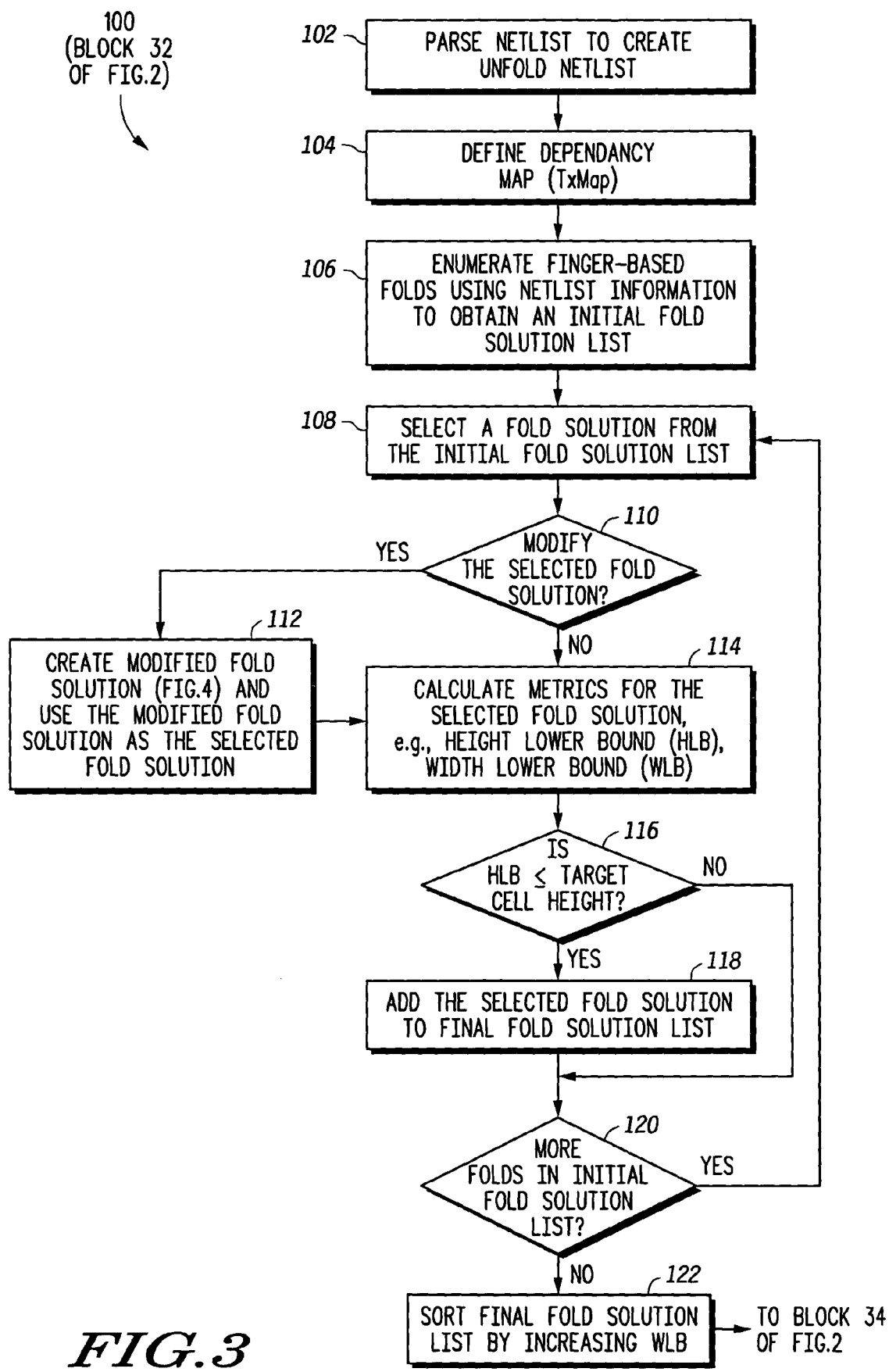
FIG. 3 illustrates, in flow diagram form, a method of fold generation in accordance with one embodiment of the present invention.

FIG. 3 illustrates a flow 100 corresponding to block 32 of FIG. 2. That is, flow 100 illustrates one embodiment of fold generation where a logical input netlist structure is transformed into a list of folds, i.e. physical netlists that are functionally equivalent but structurally distinct in accordance with one embodiment of the present invention. Each of the folded netlists is therefore capable of producing a different layout structure. Flow 100 begins with block 102 where the received transistor netlist is parsed to create an unfolded netlist. That is, the received transistor netlist is unsplit and unfolded. For example, in some embodiments, the received transistor netlist may include schematic representations of folded transistors that need to be unfolded. In alternate embodiments, the received netlist may be used as the unfolded netlist, without the need for modification. Flow proceeds to block 104 where a dependency map between N and P transistors (TxMap) is defined.

A dependency map between N and P transistors holds transistor pairs that might affect the resulting cell height. This map, for example, can be represented as a bipartite graph where transistors are represented with vertices and their relations are represented with edges. Therefore, given the folding of N transistors, the P transistor folding must be calculated according to this map and vice versa (an example of which will be discussed in reference to FIGS. 10–13 below). The mutual dependency between any set of N and P transistors reflects the fact that summation of their widths may affect the cell height and therefore must satisfy the cell height constraints or should be reduced during the folding process.

Without a given transistor placement, the dependency of P and N transistors may be approximated by a wide range of heuristics. For example, the fixed transistor pairing may be obtained by circuit analysis thus producing a one-to-one dependency mapping between any two corresponding N and P transistors. Another heuristic may, for example, produce a dependency between N and P transistors with gates connected to the same net. Another heuristic may produce the empty dependency map thus leading to independent transistor folding.

The generalized mechanism for mutual dependency between N and P transistors uses hyper-edges in a hyper-graph, so that one or more P transistors can share a dependency with one or more N transistors. (Note that as used herein a hyper-graph is defined as having hyper-edges where each hyper-edge can have more than two endpoints. Therefore, a hyper-edge can be used to represent a relationship between two or more nodes of a hyper-graph.) A hyper-edge Ei that is connected to a set of P and N transistors represents a group of P and N transistors Gi that share a region of layout for purposes of calculating a Height Lower Bound (HLB) which will be described in more detail below. For example, if each transistor in a direct connected component (DCC) is to be grouped together, a hyper-edge for each DCC can be constructed. (DCC refers to a collection of transistors that can be connected through non-power drain/source net connections.) Note also that a transistor can be in one group, or have multiple dependencies and thus be connected to multiple hyper-edges.

Referring back to FIG. 3, flow proceeds from block 104 to block 106 where finger-based folds are enumerated using netlist information (e.g. the unfolded netlist created in block 102) to obtain an initial fold solution list. The finger-based fold enumeration method constructs a unique fold for N and P transistors based on the total number of fingers. The details of a finger-based method for enumerating folds in accordance with one embodiment of the invention will be described in more detail in reference to FIGS. 6–9 below. In alternate embodiments, possible folds may be enumerated using other methods. For example, a threshold-based method may be used where all transistors whose width is equal to or below a specified threshold value are folded.

After block 106, flow proceeds to block 108 where a fold solution is selected from the initial fold solution list. Flow proceeds to decision diamond 110 where it is determined whether the selected fold solution is to be modified. If so, flow proceeds to block 112 where a modified fold solution is created (as will be described below in reference to FIG. 4) and used as the selected fold solution. Flow then proceeds to block 114. If the selected fold solution is not to be modified, the selected fold solution remains unmodified and flow proceeds from decision diamond 110 to block 114. In block 114, metrics for the selected fold solution are calculated. For example, in one embodiment, the metrics calculated include height lower bound (HLB) estimations and width lower bound (WLB) estimations which take into consideration the details of design rules, such as, for example, technology spacing rules and template specifications to establish height and width lower bounds. Another metric may include HLB and WLB estimations based on P and N transistor dependency groups (as introduced above with reference to the dependency map, TxMap). Another metric may include HLB and WLB estimations based on initial transistor placement. Therefore, a variety of different metrics may be used to obtain a HLB and a WLB for the selected fold solution.

The HLB is the minimum cell height (taking into consideration the minimum bounds of any tolerances) that the selected fold solution is able to produce. The resulting physical layout may produce a greater cell height depending on the actual transistor and object placements, routing, compaction, etc., but the HLB refers to the minimum cell height that can be produced with a particular fold solution. Similarly, the WLB is the minimum cell width (taking into consideration the minimum bounds of tolerances) that the selected fold solution is able to produce. Again, the resulting physical layout may produce a greater cell width depending on the actual transistor and object placements, routing, compacting, etc., but the WLB refers to the minimum cell width that can be produced with a particular fold solution. Note also that the more accurate the metric calculations are, the better the HLB and WLB estimates are. That is, if too many estimation assumptions are made in calculating the metrics, the resulting HLB and WLB estimates will provide possible fold solutions that in reality are not possible, and time will be unnecessarily spent evaluating these fold solutions with the flow of FIG. 2.

As stated above, in one embodiment, the metrics calculated include height lower bound (HLB) estimations and width lower bound (WLB) estimations which take into consideration the details of design rules, such as, for example, technology spacing rules and template specifications. In this embodiment, a pairing of P and N transistors is used to generate the HLB estimate. For example, an assumption is made that in a single-row P and N style layout, cell height is at least the minimum possible of P and N transistor heights and minimum rules needed to place them in the cell. Therefore, a lower bound can be constructed by pairing off P and N transistors in such a way to be a minimal height pairing. This can be done by ordering the P transistors from largest (i.e. greatest width) to smallest (i.e. shortest width) and ordering the N transistors in reverse order.

Figure 1:
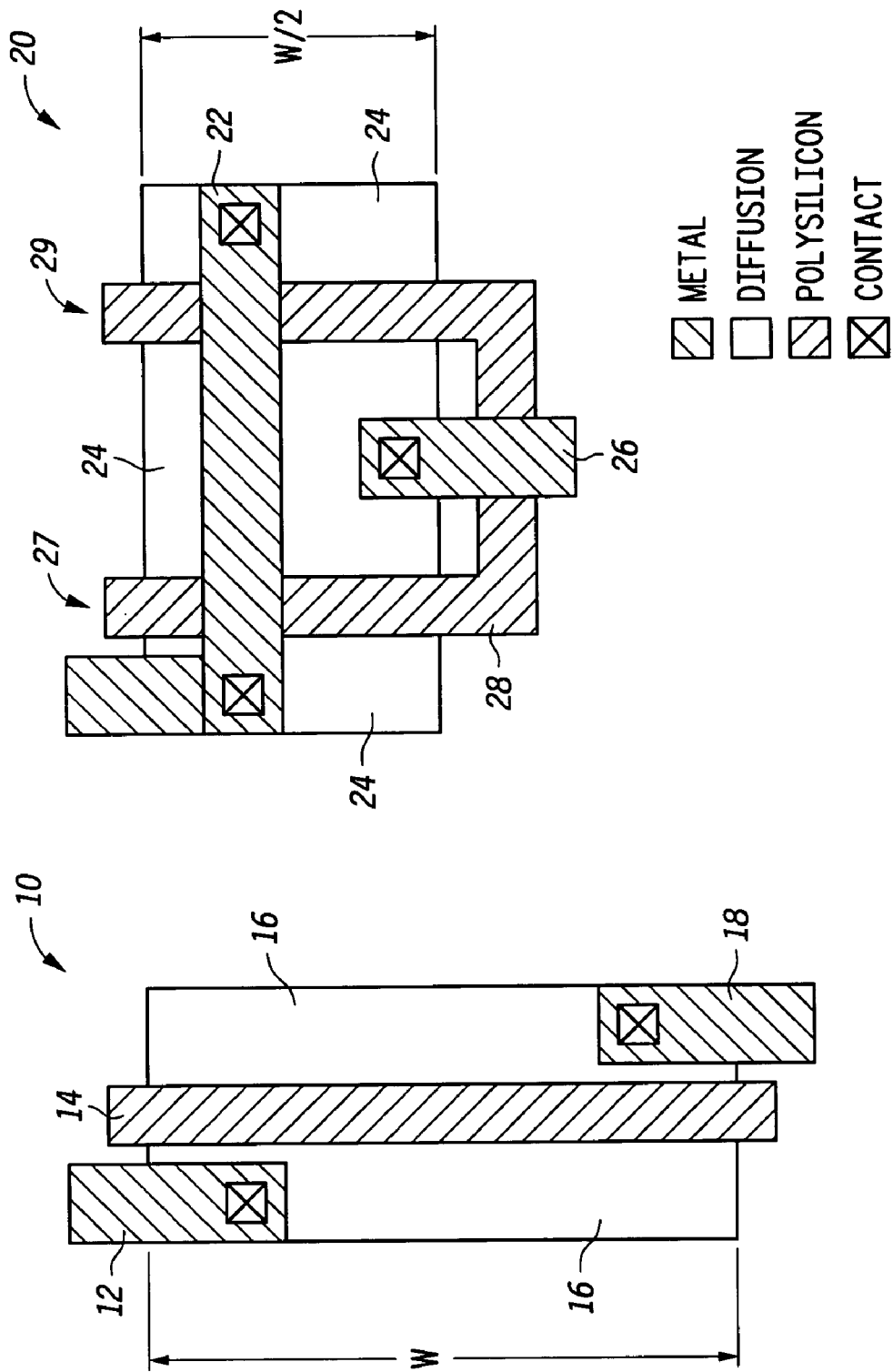
FIG. 1 illustrates a prior art transistor folding.
Figure 16:
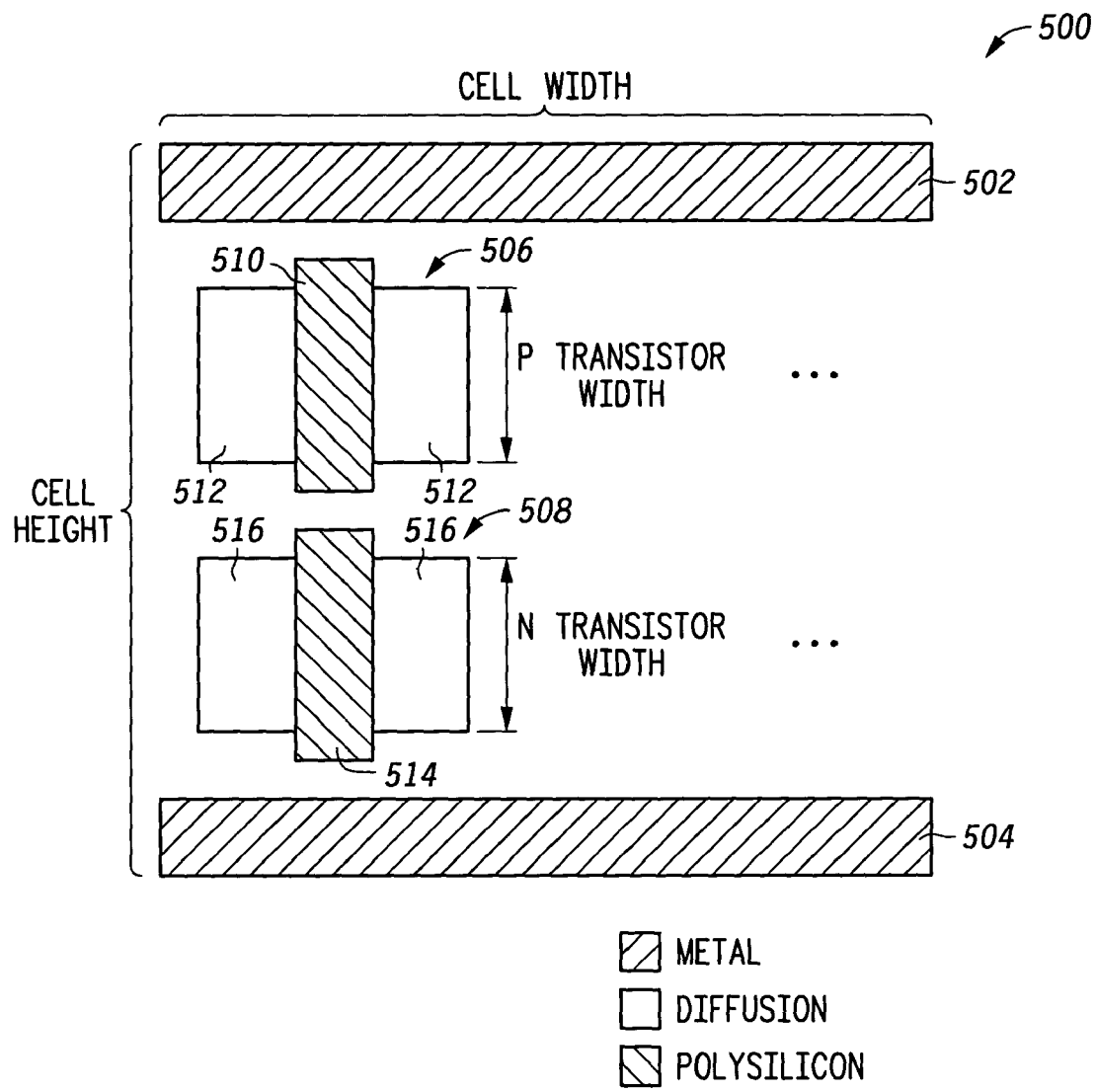
FIG. 16 illustrates a cell layout in accordance with one embodiment of the present invention.

FIG. 16 illustrates an example cell layout 500 in accordance with one embodiment of the present invention. Note that cell layout 500 includes a cell having a power rail 502 and a ground rail 504. Cell layout 500 also includes P transistor 506 along power rail 502 and N transistor 508 along ground rail 504. Note that only two transistors are illustrated in FIG. 16; however, cell layout 500 may include any number of N and P transistors that fit within the cell width, as indicated in FIG. 16. Also, in the current example, the cell height is the total height from the top of power rail 502 to the bottom of ground rail 504. Each of transistors 506 and 508 include a polysilicon region 510 and 514, respectively, and a diffusion region 512 and 516, respectively. As described in reference to FIG. 1, the transistor width corresponds to the distance along the polysilicon regions overlapping the diffusion regions. Therefore, P transistor width and N transistor width (labeled in FIG. 16) are measured in a direction orthogonal to the cell width. That is, the transistor width affects the cell height. The total cell height therefore includes the sum of P transistor width and N transistor width and any additional space required between the transistors and railings as defined by any design rules. (Note that the connections of the transistors and rails within cell layout 500 are not shown for the sake of simplicity.)

Figure 5:
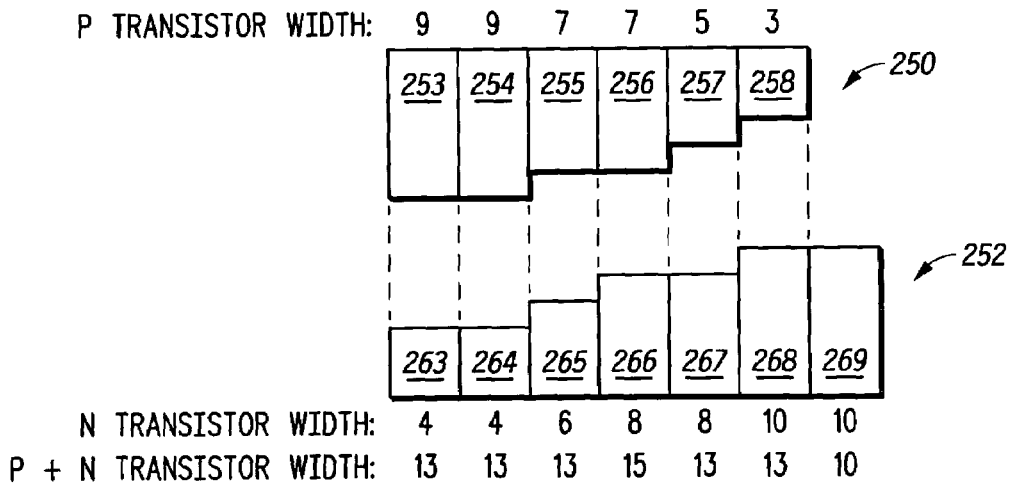
FIG. 5 illustrates transistor pairings in accordance with one embodiment of the present invention.

FIG. 5 illustrates an example of pairing off P transistors 250 and N transistors 252 using the assumption (described above) that in a single-row P and N style layout, cell height is at least the minimum possible of P and N transistor heights and minimum rules needed to place them in the cell. P transistors 250 are ordered by decreasing width (P transistor 253 to P transistor 258). P transistor 253 and P transistor 254 each have a transistor width, W, of 9. Note that P transistor 253 and P transistor 254 may be the resulting fingers from folding an originally unfolded transistor having a width, W, of approximately 18. Similarly, N transistor 266 and N transistor 267 may be the resulting fingers from folding an originally unfolded transistor having a width, W, of approximately 16. Therefore, the P and N transistors can be paired off, where P transistor 253 is paired with N transistor 263 for a total transistor width of 13, P transistor 254 is paired with N transistor 264 for a total transistor width of 13, P transistor 255 is paired with N transistor 265 for a total transistor width of 13, P transistor 256 is paired with N transistor 266 for a total transistor width of 15, P transistor 257 is paired with N transistor 267 for a total transistor width of 13, and P transistor 258 is paired with N transistor 268 for a total transistor width of 13.

If one set of transistors (either P transistors 250 or N transistors 252) have a larger number of transistors than the other by k elements, then the k largest transistors are used as a width measure alone, and the remaining smaller transistors are paired. Therefore, as seen in FIG. 5, N transistors 252 include 7 transistors while P transistors 250 include 6 transistors. Since N transistors 252 includes one more transistor than P transistors 250, the largest N transistor (N transistor 269) is not paired with a P transistor, and the total transistor width for N transistor 269 is 10, the same as the N transistor width.

The largest total transistor width, corresponding to 15 for P transistor 256 and N transistor 266, is used to come up with the HLB estimate. For example, 15 may be used as the HLB estimate; however, in order to determine a more realistic HLB estimate and WLB estimate, design rules can be taken into consideration. For example, the HLB estimate can be determined by calculating the P and N transistor widths for the paired transistor, and adding the needed distance between P and N transistor channels, the area between the P transistor channel and the cell boundary, and the area between the N transistor channel and the cell boundary. The WLB estimate can be calculated as the larger of the P transistor WLB estimate and N transistor WLB estimate. The P and N transistor WLB estimates can be calculated separately by determining how the transistors could be arranged in a minimum width configuration taking into consideration design rules.

As mentioned above, another metric may include HLB and WLB estimations based on P and N transistor dependency groups (as introduced above with reference to the dependency map, TxMap). These HLB and WLB estimates take into account known dependencies and expected configurations of P and N transistors. For example, as discussed above, a dependency map of P and N transistors can be defined as a hyper-graph such that each dependency group of P and N transistors is defined by a hyper-edge that covers a set. Each transistor is defined in one or more dependency groups. Possible dependency groups may be: pairs of matched P and N transistors with the same inputs, DCCs, etc. For a dependency group based HLB estimation, the P transistors within each group are ordered from smallest to largest and the N transistors with each group are ordered from largest to smallest. For each group, the P and N transistors are then paired as described above in reference to FIG. 5. The maximum total width can then be used to determine the HLB estimate, as described above.

Referring back to FIG. 3, after block 114, flow proceeds to decision diamond 116 where it is determined whether the HLB estimate is less than the target cell height (where the target cell height corresponds to the cell height constraint, as described in reference to FIG. 2). That is, in one embodiment, the target cell height corresponds to the height of a standard cell. If the HLB estimate is less than the target cell height (i.e., the estimate meets the cell height constraint), flow proceeds to block 118 where the selected fold solution is added to a final fold solution list, and flow proceeds to decision diamond 120. However, if the HLB estimate is not less than or equal to the target cell height, flow bypasses block 118 to decision diamond 120. That is, since the HLB estimate (corresponding to the minimum cell height possible) is greater than the target cell height, it will not be possible for the resulting physical layout to meet the cell height constraint, and therefore, it is not added to the final fold solution list. As mentioned above, the more accurate the resulting HLB estimate is, the more invalid fold solutions get pruned from the initial fold solution list, thus resulting in a more accurate final fold solution list in that each solution in the final fold solution list can potentially meet the cell height constraint. A more accurate final fold solution list will result in a more efficient layout generation flow of FIG. 2.

At decision diamond 120, if there are still more folds in the initial fold solution list, flow proceeds to block 108 where a next fold solution is selected, thus becoming the new selected fold solution, and the flow continues with decision diamond 110 as was described above. If, at decision diamond 120, no more folds remain in the initial fold solution list, flow proceeds to block 122 where the final fold solution list is sorted by increasing WLB estimates. In this manner, in the flow of FIG. 2, the fold solutions of the sorted final fold solution list can be evaluated beginning with the one providing the best HLB and WLB estimates. However, in alternate embodiments, the final fold solution list can be sorted according to different criteria other than by the WLB estimates. Alternatively, the final fold solution list may not be sorted at all. Flow then continues with block 34 as described above in reference to FIG. 2.

Figure 4:
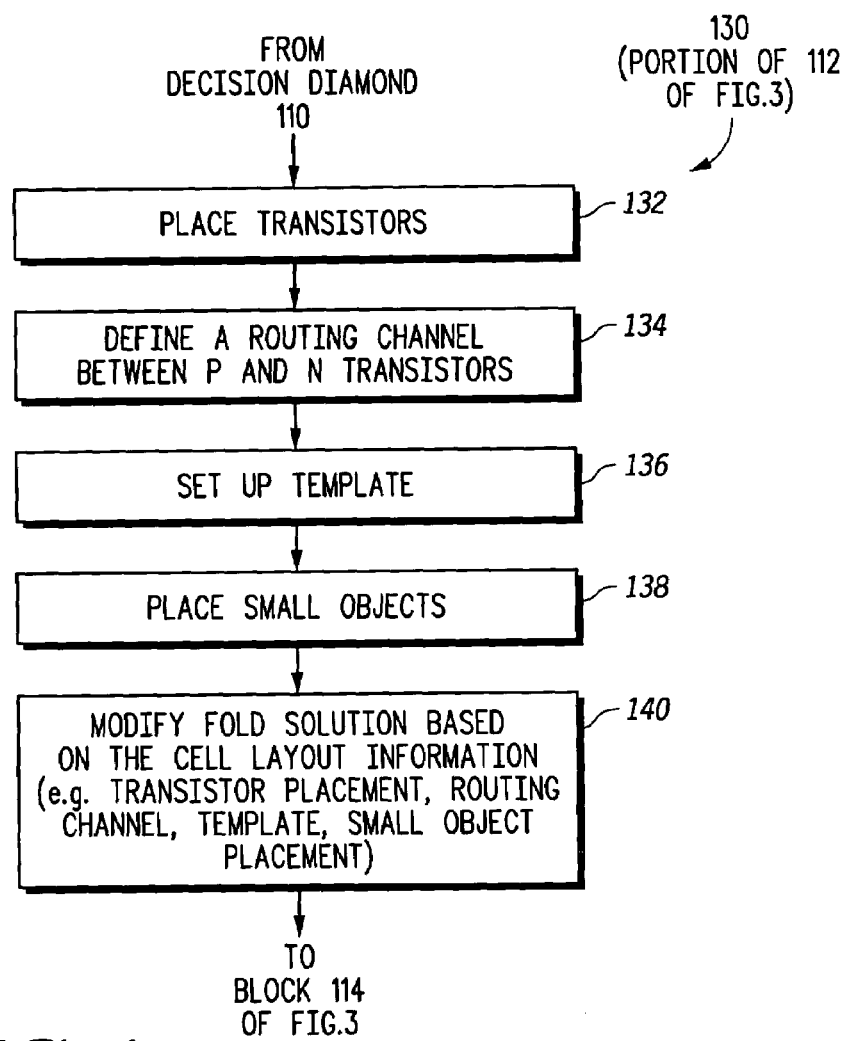
FIG. 4 illustrates, in flow diagram form, a method of creating a modified fold solution in accordance with one embodiment of the present invention.

FIG. 4 illustrates a flow 130 of block 112 of FIG. 3. Flow 130 illustrates the creation of a modified fold solution in accordance with one embodiment of the present invention. First, in block 132, the transistors are initially placed. The initial placement is generally a fast placement constructed in a single row P and N style. Note that the initial placement is an initial placement only and does not restrict or determine the final placement of the cell later in the layout synthesis process of FIG. 2. Flow proceeds to block 134 where a routing channel between P and N transistors is defined. In block 134, a virtual channel is generated and its density is calculated in two general steps: (1) determining pin assignment to the channel boundary, and (2) calculating the local channel density for each channel column. Flow proceeds to block 136 where the template is setup. Finger size on the left and right side of a cell should be reduced to meet well height template constraints. An accurate frame for the folding configuration is therefore defined so that folds can be adjusted accordingly in block 140. For example, if there are template objects that would further constrict the available space for folding, they are added to the initial placement previously produced in block 132. Flow proceeds to block 138 where small objects, such as diodes or ties, are placed into the template.

Flow proceeds block 140 where the fold solution is modified based on cell layout information. The cell layout information corresponds to the information determined in blocks 134, 136, and 138. Alternate embodiments may not perform all of blocks 134, 136, and 138. That is, alternate embodiments may use less cell information, or alternatively, more or different information than that illustrated in FIG. 4. The modified solution attempts to fit transistors within modified transistor boundaries as densely as possible. For example, P and N strip boundaries are modified in order to exclude overlapping between transistor strips and small objects and template objects. Also, folds themselves can be modified to conform to the modified strip boundaries. For example, finger sizes on the left and right of the cell can be reduces to meet well height template constraints so long as the increase in the other finger sizes (to compensate for the finger size reduction) does not cause the cell to exceed the target cell height. Another example includes modifying folded finger sizes to accommodate small objects such as diodes or ties. This can be done if the increase in any finger size does not cause the cell to exceed the target cell height.

Figure 6:
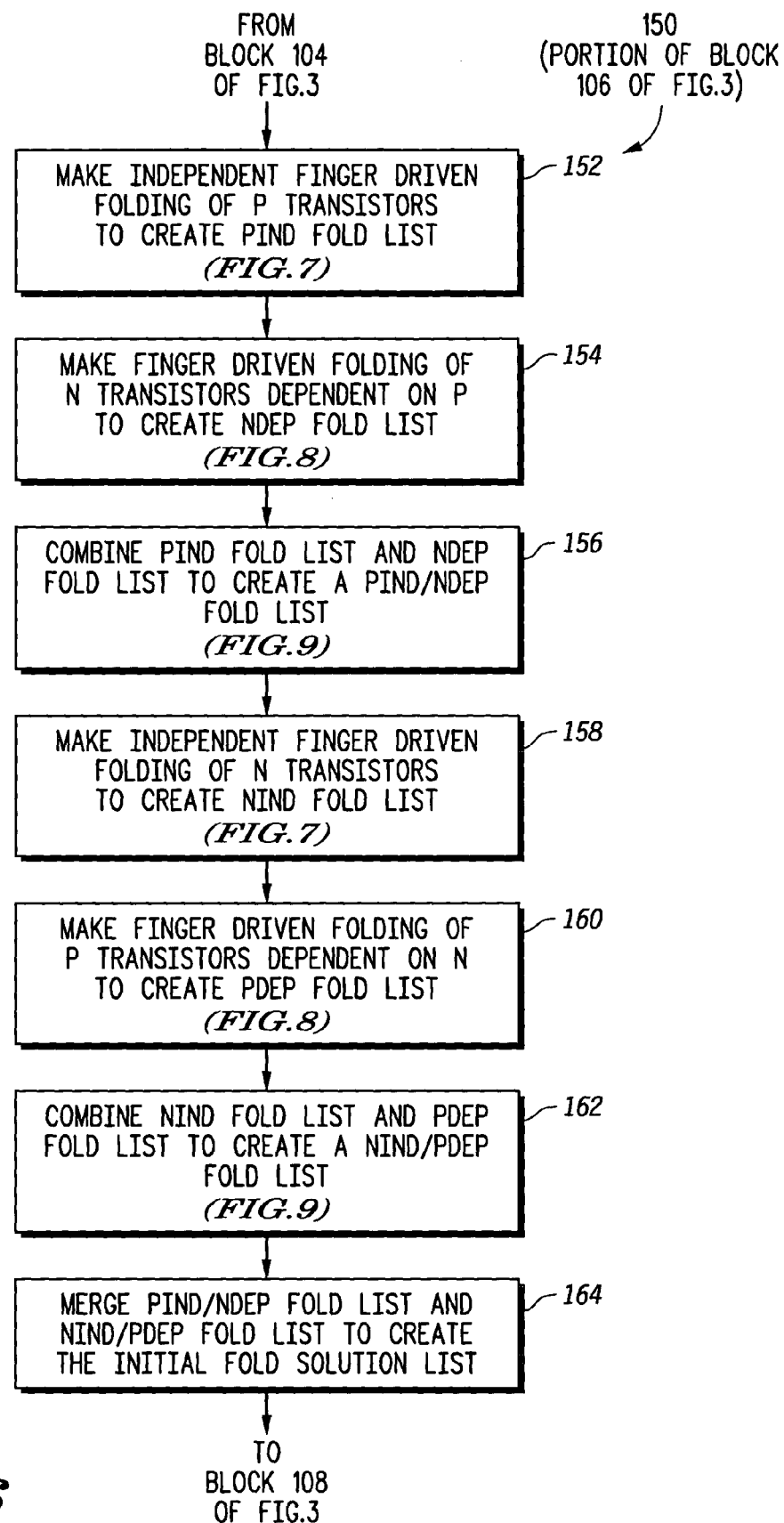
FIG. 6 illustrates a method of enumerating finger-based folds in accordance with one embodiment of the present invention.

FIG. 6 illustrates one embodiment of a finger-based fold enumeration method. Flow begins with block 152 where independent finger driven folding of P transistors is made to create a P Independent (PIND) fold list. Therefore, the PIND fold list is a list of foldings for that row of transistors with a number of resulting transistors (fingers) increasing by one for each subsequent folding. In this method, the one transistor which tentatively has the maximal impact on the cell height is folded. Therefore, the folding is done by increasing the number of resulting fingers of that transistor by one thus implying a minimal incremental changes to the cell width at each folding. (Note that in the threshold-based folding method discussed above, the threshold based transistor folding is done for all transistors with a width greater than the selected threshold value thus increasing the number of resulting fingers by a number of folded transistors which may be greater than one.) The detail of the independent finger driven folding will be described in more detail in reference to FIG. 7.

In FIG. 6, flow proceeds from block 152 to block 154 where a finger driven folding of N transistors dependent on P is made to create an N dependent on P (NDEP) fold list. That is, given the list of independent finger-based transistor folding (PIND fold list) for one row (P transistor row), the depending finger-based transistor folding for the opposite row (N transistor row) is performed. The same method as used with the independent folding is generally used, except that the impact of transistor size onto the cell height is being calculated according to the known dependencies between transistors, where the known dependencies are provided in the dependency map, TxMap. This allows for the prediction with some degree of uncertainty the possible (but yet unknown) relative placement of transistors in opposite rows and approximate cell height. The details of the dependent finger driven folding will be described in more detail in reference to FIG. 8.

Flow proceeds from block 154 to block 156 where the PIND fold list and the NDEP fold list are combined to create the resulting PIND/NDEP fold list constructed by pairing each independent transistor folding with each folding dependent on it. The details of the combination in block 156 will be described in more detail in reference to FIG. 9 below.

Flow then proceeds to block 158 where independent finger driven folding of N transistors is made to create an N Independent (NIND) fold list. Block 158 is analogous to block 152, except that N transistors are being folded rather than the P transistors. The details of block 158 are therefore also covered in more detail in reference to FIG. 7. Flow then proceeds from block 158 to block 160 where a finger driven folding of P transistors dependent on N is made to create a P dependent on N (PDEP) fold list. Again, the method of block 160 is analogous to block 154, the details of which will be covered in reference to FIG. 8. Flow then proceeds from block 160 to 162 where the NIND fold list and the PDEP fold list are combined to create the resulting NIND/PDEP fold list constructed by pairing each independent transistor folding with each folding dependent on it. The combination in block 162 is analogous to block 156 and will be described in more detail in reference to FIG. 9 below. Flow then proceeds from block 162 to block 164 where the PIND/NDEP fold list and the NIND/PDEP fold list are merged together to create the initial fold solution list. Note that blocks 152–156 and blocks 158–162 can be performed in reverse order, meaning that in an alternate embodiment, blocks 158–162 may be performed prior to blocks 152–156. Alternatively, they can be performed simultaneously.

Figure 7:
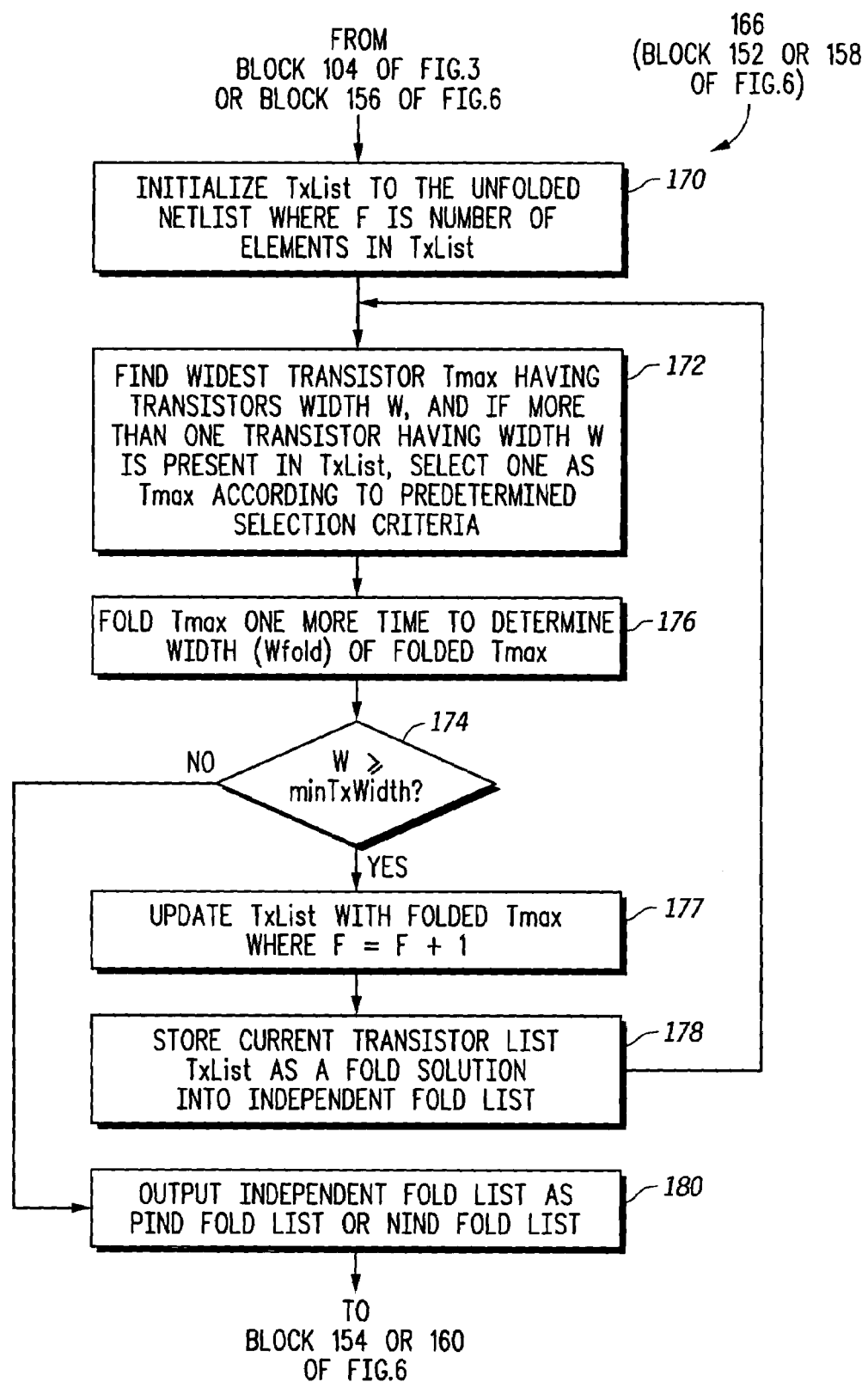
FIG. 7 illustrates a method of created independent finger driven foldings in accordance with one embodiment of the present invention.

FIG. 7 illustrates a flow 166 of block 152 or 158 of FIG. 6. That is, flow 166 illustrates one embodiment of a method to create an independent fold list. Therefore, for block 152 of FIG. 6, flow 166 is used to create an independent fold list of P transistors, corresponding to PIND fold list, and for block 158 of FIG. 6, flow 166 is used to create an independent fold list of N transistors, corresponding to NIND fold list. Flow begins with block 170 (which, depending on which list is being created, can be entered after block 104 of FIG. 3 or after block 156 of FIG. 6). In block 170, TxList is initialized to the unfolded netlist (created in block 102 of FIG. 3) such that TxList is the unfolded netlist, where F is the number of elements (i.e. the number of unfolded transistors) in TxList. Flow proceeds to block 172 where the widest transistor, Tmax, having a transistor width W, is selected from TxList. If there is more than one transistor in TxList having the same maximum width W, then one is chosen as Tmax according to predetermined selection criteria. The predetermined selection criteria may include, for example, selecting a transistor which has the largest number of fingers. (However, note that in alternate embodiments, all transistors having maximum width W may be selected.)

Flow then proceeds to block 176 where Tmax is folded once more time in order to determine the width (Wfold) of the resulting folded Tmax. That is, Tmax is folded such that the number of fingers is increased by one. For example, FIGS. 10 and 11 provide an example of creating independent foldings of P transistors. FIG. 10 includes a transistor circuit 300 which may be represented as an unfolded transistor netlist having four transistors coupled as shown in FIG. 10 where transistor PTx1 302 is coupled to transistor NTx1 304, and transistor PTx2 306 to transistor NTx2 308. Therefore, TxList created in block 170 would include transistors PTx1 and PTx2 when the PIND fold list is created, and transistors NTx1 and NTx2 when the NIND fold list is created. For the current description, it will be assumed that the independent finger foldings of the P transistors is being created such that TxList includes PTx1 and PTx2. In the example of FIG. 10, note that PTx1 has a width, W, of 20 and PTx2 has a width, W, of 10. FIG. 11 illustrates subsequent independent foldings of P transistors, with the PF below each iteration indicates the number of P fingers in the current iteration. The first iteration 320 illustrates P transistors PTx1 and PTx2 prior to any foldings. Transistor PTx1 is selected as Tmax (block 172 of FIG. 7) since its width 20 is greater than any other P transistors in TxList (i.e. PTx2, which as a width of 10). PTx1 is then folded one more time (block 176 of FIG. 7) which results in two fingers, each of width 10. Therefore, Wfold, the width of the folded Tmax is 10.

Flow proceeds to decision diamond 174 where it is determined whether Wfold is greater than or equal to a minimum transistor width, minTxWidth. For example, minTxWidth may correspond to the smallest allowable transistor width. (In one embodiment, minTxWidth is selected to be 5 such that no transistor in the resulting solution will have a width smaller than 5. Alternate embodiments may choose any value, as appropriate, for minTxWidth) Therefore, if Wfold is greater than or equal to minTxWidth, flow proceeds to block 177 where Tmax in TxList is replaced with the folded Tmax, such that F=F+1. Therefore, the number of fingers is increased by one. Thus, referring back to FIG. 11 (and assuming that 10 is greater than or equal to minTxWidth), PTx1 is folded one more time to produce the next iteration 322 where PTx1 is folded into two fingers, each of width 10, and PTx2 remains unfolded. TxList is therefore updated to reflect the resulting folds of iteration 322. (Note that if Wfold is determined to be less than minTxWidth, TxList would not be updated with the folded Tmax such that Tmax would remain unfolded.)

Referring back to FIG. 7, if Wfold is greater than or equal to minTxWidth, flow proceeds to block 178 where the current transistor list, TxList, now having three transistors (PTx2 and the two fingers of PTx1), is stored as a possible fold solution into the independent fold list (which, at the end of flow 166, will contain a list of possible fold solutions, where each fold solution corresponds to a version of TxList stored in block 178). Flow then returns to block 172 where a new Tmax is selected, just as described above. Therefore, in FIG. 11, a Tmax is selected from iteration 322. In this example, all transistors (PTx1 and PTx2) have a width of 10 (due to the previous folding of PTx1); therefore, predetermined selection criteria may be used to identify one of the two transistors as Tmax. In the example of FIG. 11, PTx2 is selected as Tmax. Flow then proceeds to block 176 where Tmax is folded one more time. Therefore, PTx2 (of iteration 322) is folded once to produce two fingers each having a width (Wfold) of 5. This width (Wfold) is then compared with minTxWidth, and if it is greater than or equal to minTxWidth, flow proceeds to block 177 where TxList is updated with the folded Tmax. Therefore, as illustrated in iteration 324 of FIG. 11, TxList is now updated by replacing PTx2 with the two resulting fingers such that TxList now includes four transistors: the two fingers of PTx1 and the two fingers of PTx2. Flow proceeds to block 178 where the updated TxList is stored as another possible fold solution into the independent fold list.

Flow then returns to block 172 where a new Tmax from iteration 324 is selected. In this case, PTx1 is selected as Tmax because it has a width of 10 (because it was already previously folded). PTx1 is folded once more time such that the number of folds, F, is increased by one. Therefore, PTx1, instead of being folded into two fingers (as was first done in iteration 322), it is folded into 3 fingers (such that F=F+1). Therefore, PTx1 is now folded into 3 fingers, where each finger has a width of one third of the original transistor width, which, in this example, is $20/3$ which is 6.7. If 6.7 is still greater than or equal to minTxWidth, TxList is updated by replacing Tmax (i.e. PTx1) with the new folding. Thus, as can be seen in FIG. 11, iteration 324 has 4 fingers while the subsequent iteration now has 5 fingers, such that F=F+1. Therefore, resulting iteration 326 is stored as another possible fold solution in the independent fold list.

Flow then returns to block 172 where PTx1, now having a width W of 6.7, is again selected as Tmax, and flow proceeds as was described above. If, at any time during the flow of FIG. 7, upon reaching decision diamond 174, the resulting Wfold (from block 176) is not greater than or equal to minTxWidth, flow proceeds to block 180 where the independent fold list that has been created is output as either PIND fold list or NIND fold list. (Note that the most recent fold from the previous block 176 which produced the Wfold that was not greater or equal to than minTxWidth is not included in TxList.) In the current example, the independent fold list is output as PIND fold list, representing the independent foldings of the P transistors PTx1 and PTx2. Flow then proceeds with either block 154 or block 160 of FIG. 6. Therefore, in the current example, PIND fold list is created which contains possible fold solutions corresponding to iterations 322, 324, and 326 of FIG. 11.

Figure 8:
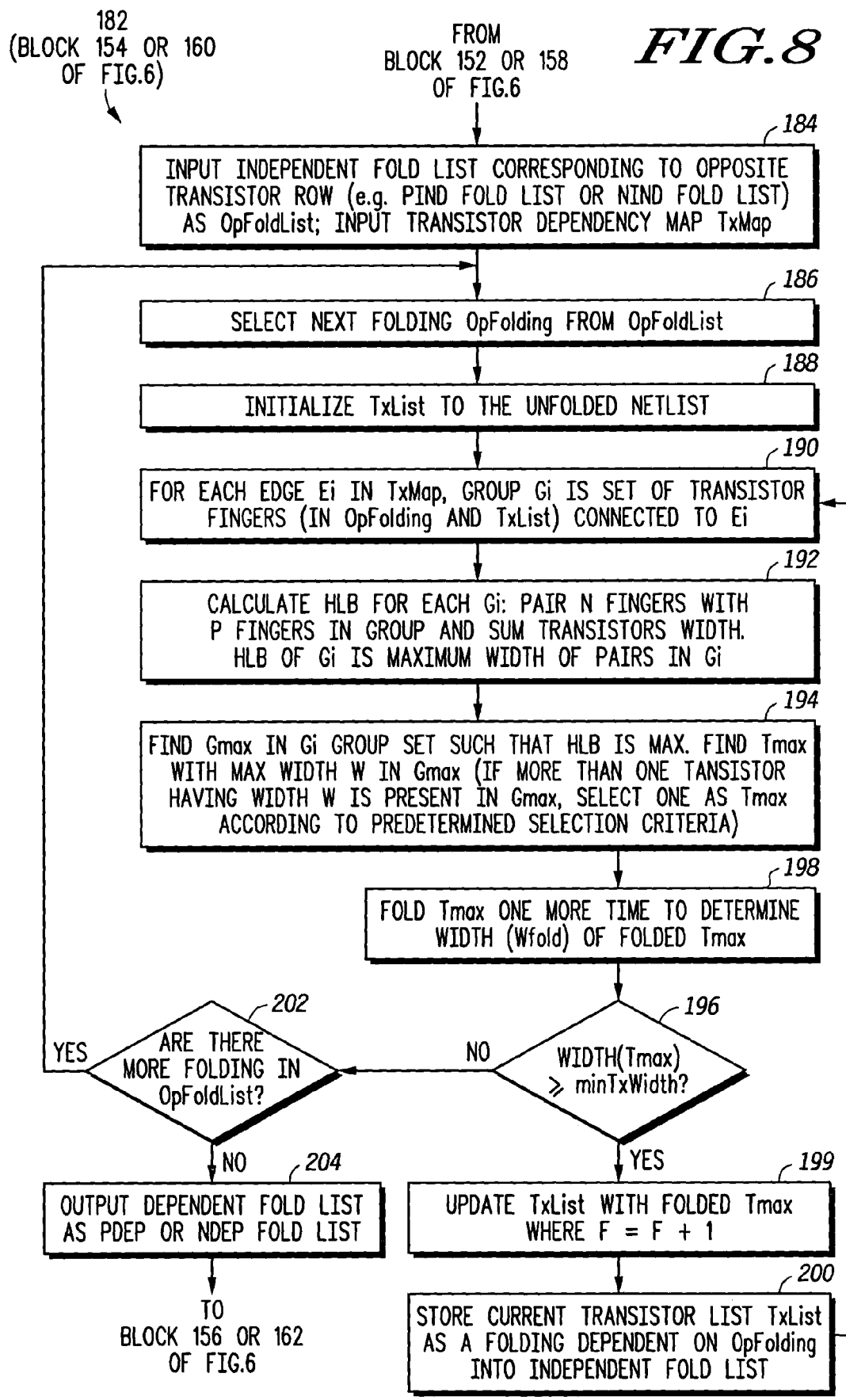
FIG. 8 illustrates a method of creating dependent finger-driven foldings in accordance with one embodiment of the present invention.

FIG. 8 illustrates a flow 182 of block 154 or 160 of FIG. 6. That is, flow 182 illustrates one embodiment of a method to create a dependent fold list. Therefore, for block 154 of FIG. 6, flow 182 is used to create a dependent fold list of N transistors that are dependent on the P transistors, corresponding to NDEP fold list, and for block 160 of FIG. 6, flow 182 is used to create a dependent fold list of P transistors that are dependent on the N transistors, corresponding to PDEP fold list. The following explanations will be given with reference to FIGS. 12 and 13, which correspond to the same example as FIGS. 10 and 11. Therefore, as above, the description of FIG. 8 will be given assuming it corresponds to block 154 of FIG. 6 where an NDEP fold list is created which includes a fold list of N transistors dependent on the P transistors.

In FIG. 8, flow begins with block 184 where the independent fold list corresponding to the opposite transistor row is input as OpFoldList. Therefore, in the current example corresponding to block 154 of FIG. 6, since a finger driven foldings of N transistors (dependent on P transistors) is being created, the opposite row corresponds to the P transistors. In block 184, PIND fold list (created previously in block 152 of FIG. 6) is input as OpFoldList. (Similarly, if the current example corresponded to block 160, the opposite row corresponds to the N transistors and NIND fold list would be input as OpFoldList.) Also in block 184, the transistor dependency map, TxMap, that was discussed above, is input.

Note that FIG. 10 includes an example of a dependency map 310 which corresponds to the transistor circuit 300, and will be used in the example of FIGS. 12 and 13. Dependency map 310 includes four nodes, each corresponding to a transistor (NTx1, NTx2, PTx1, and PTx2). Note that the node corresponding to transistor NTx1 304 is coupled to transistor PTx1 302 by a graph edge 312 to form a group G1 316. Therefore, this indicates that transistor NTx1 304 and PTx1 302 are dependent on each other, and it is likely that in the actual layout, they will be placed in line with each other (e.g. with NTx1 above or below PTx1 in the actual cell layout). Also, the node corresponding to transistor NTx2 308 is coupled to transistor PTx2 306 by another graph edge 314 to form a group G2 318. Therefore, this indicates that transistor NTx2 308 and PTx2 306 are dependent on each other, and it is likely that in the actual layout, they will be placed in line with each other (e.g. with NTx2 above or below PTx2 in the actual cell layout). The dependency graph 310 may include these two dependencies since the dependent transistors share a common input, indicating a higher likeliness that they will be placed together within the physical cell. As described above, a dependency map may be created using a variety of different criteria, such as shared inputs.

Referring back to FIG. 8, flow proceeds from block 184 to block 186 where a next folding, referred to as OpFolding, is selected from the OpFoldList. Therefore, using the example of the PIND fold list created using the example of FIG. 11, the first folding corresponds to the fold solution given by iteration 322 in FIG. 11. In the current example, this folding is selected as the OpFolding, as is illustrated in FIG. 12 by the dotted lines in each of iterations 328, 330, and 332. Flow proceeds to block 188 where TxList is initialized to the unfolded netlist. In the current example, corresponding to block 154 of FIG. 6, TxList is initialized to include the unfolded N transistors NTx1 and NTx2. Flow then proceeds to block 190 where, for each edge Ei in TxMap, a group G1 is defined as a set of transistor fingers (in OpFolding and TxList) connected to Ei. Therefore, in the current example of FIG. 10, for edge 312, a group G1 316 includes NTx1 and PTx1, and for edge 314, a group G2 318 includes NTx2 and PTx2.

Flow proceeds to block 192 where an HLB is calculated for each Gi where the N fingers are paired with the P fingers within a group (using the pairing method described above in reference to FIG. 5 for each Gi), and the transistor widths of the paired P and N fingers are summed. The maximum sum is then used to determine the HLB of the group Gi. Therefore, for example, in FIG. 12, iteration 328 illustrates the N transistors (NTx1) of group G1 316 paired with the P transistors (PTx1) of group G1 316. Therefore, NTx1 (which has not yet been folded) is paired with a first finger of PTx1, resulting in a total width of 10+10 which is 20. The second finger of PTx1 is not paired with an N transistor because group G1 316 currently includes only one N transistor (NTx1), thus resulting in a width of 10. Therefore, the HLB of group G1 316 is 20 (alternatively, design rules as described above can be taken into consideration along with the summed width of 20 to determine the HLB). Similarly, iteration 328 also illustrates the N transistors (NTx2) of group G2 318 paired with the P transistors (PTx2) of group G2. Therefore, a first finger of NTx2 (after already having been folded once) is paired with PTx2 (which is not folded), resulting in a total width of 10+10 which is 20. A second finger of NTx2 is not paired with a P transistor because group G2 318 currently includes only one P transistor (PTx1), thus resulting in a width of 10. Therefore, the HLB of group G2 318 is also 20 (alternatively, design rules as described above can be taken into consideration along with the summed width of 20 to determine the HLB).

Flow proceeds to block 194 where the Gmax of each group Gi is selected such that HLB is the maximum. Then, a transistor Tmax having the maximum width, W, within Gmax is selected. As described above, if more than one Gmax or Tmax is present, predetermined selection criteria may be used to select a single Gmax or Tmax. Therefore, in iteration 328 of FIG. 12, group G1 316, has an HLB of 20 as does group G2 318. Therefore, predetermined selection criteria is used to select group G1 316 in the current example. Then the N transistor with the maximum width is selected as Tmax. In G1 316 of iteration 328 of FIG. 12, NTx1 is selected as Tmax. Flow then proceeds to block 198, where, as in FIG. 7, Tmax is folded one more time such that the number of fingers is increased by one. The width (Wfold) of the resulting folded Tmax is therefore determined. Flow proceeds to decision diamond 196, where, as in FIG. 7, Wfold is compared with minTxWidth.

If Wfold is greater than or equal to minTxWidth, flow proceeds to block 199 where Tmax in TxList is replaced with the folded Tmax, such that F=F+1. Therefore, only if Wfold is greater than or equal to minTxWidth is TxList updated with the new folding of Tmax. Referring back to FIG. 12, NTx1 is therefore folded one more time to produce the next iteration 330 where NTx1 is folded into two fingers, each of width 5 (i.e. Wfold=5), and NTx2 is not folded in the current iteration. Assuming 5 is greater than or equal to minTxWidth, TxList is updated where NTx1 is replaced with the two fingers of NTx1 such that TxList includes one more transistor than before. Flow proceeds to block 200 where the updated TxList is stored as a fold solution dependent on OpFolding into the dependent fold list. Therefore, dependent fold list will include various possible fold solutions that are dependent upon each different fold solution in OpFolding.

Flow then returns to blocks 190, 192, and 194 where HLBs are calculated for each group, and a Gmax and Tmax are selected. In iteration 330, G1 316 has a maximum HLB of 15 and G2 318 has a maximum HLB of 20; therefore, G2 318 is selected as Gmax. Within G2 318, NTx2, with a width of 10, is selected as Tmax. Flow then proceeds to block 198 where Tmax (NTx2) is folded one more time such that the number of folds, F, is increased by one. Therefore, NTx2, instead of being folded into two fingers (as in iterations 328 and 330), it is folded into 3 fingers. Therefore, NTx1 is now folded into 3 fingers, where each finger has a width of one third of the original transistor width, which, in this example, is 20/3 which is 6.7. Assuming 6.7 (Wfold) is greater than or equal to minTxWidth, flow proceeds to block 199 where TxList is updated with the folded Tmax resulting in iteration 332. Therefore, iteration 330 has 4 fingers while the subsequent iteration 332 now has 5 fingers, where F=F+1. Flow proceeds to block 200 where iteration 332 is stored as another possible fold solution in the dependent fold list.

Flow then returns to blocks 190, 192, and 194 where G2 318 is selected as Gmax and NTx2, now having a width W of 6.7, is again selected as Tmax, and flow proceeds as described above. If, at any time during the flow of FIG. 8, upon reaching decision diamond 196, the resulting Wfold (from block 198) is not greater than or equal to minTxWidth, flow proceeds to decision diamond 202. (Note that the most recent fold from the previous block 198 which produced the Wfold that was not greater than or equal to minTxWidth is not included in TxList.) In decision diamond 202, it is determined if more foldings exist in OpFoldList. In the current example, more foldings do exist, thus returning the flow to block 186 where a next folding OpFolding is selected from OpFoldList. As illustrated in FIG. 13 by the dotted lines, the new OpFolding corresponds to the fold solution of iteration 324 of FIG. 11 (the fold solution subsequent to iteration 322 used in FIG. 12). The same process described above with reference to FIG. 12 is therefore repeated in FIG. 13. That is, the N fingers and P fingers within each group (G1 316 and G2 318 in the current example) are paired as shown in FIG. 13 (using the pairing method described in reference to FIG. 5 for each group). Therefore, in iteration 334, G1 316 includes NTx1 and the two fingers of folded PTx1, in accordance with dependency map 316. Similarly, in iteration 334, G2 318 includes the two fingers of folded PTx2 and the two fingers of folded NTx2, in accordance with dependency map 316.

In iteration 334 of FIG. 13, G1 316 is selected as Gmax, and NTx1 is selected as Tmax. NTx1 is folded one more time to produce iteration 336 which is stored as another possible fold solution in the dependent fold list. Then, in iteration 336, G2 318 is selected as Gmax (using predetermined selection criteria since both G1 316 and G2 318 have a maximum HLB of 15), and NTx2 is selected as Tmax. NTx2 is folded one more time (corresponding to three folds which is one more than two folds) in order to produce iteration 338 where NTx2 is folded three times to produce three fingers, each of width 6.7 The fold solution corresponding to iteration 338 is therefore stored into the dependent fold list. Flow proceeds where G1 316 is now selected as Gmax, having an HLB of 15, and NTx1 is selected as Tmax, having a width of 5. If 5 is greater than or equal to minTxWidth, then a subsequent iteration is produced (not shown) as described above. However, if 5 is not greater than or equal to minTxWidth, flow proceeds to the next folding in OpFolding, if any. (For example, although not shown in the figures, the method of blocks 188–200 would be repeated using a next folding solution from OpFoldList which corresponds to iteration 326 of FIG. 11.)

Therefore, if at decision diamond 202, no more foldings exist in OpFoldList, the dependent fold list that has been created is output as either NDEP fold list or PDEP fold list. In the current example, the dependent fold list is output as NDEP fold list, representing the dependent foldings of the N transistors NTx1 and NTx2 dependent on the foldings of P transistors PTx1 and PTx2. Flow then proceeds with either block 156 or block 162 of FIG. 6. Therefore, in the current example, NDEP fold list is created which contains possible fold solutions corresponding to iterations 328, 330, and 332 of FIG. 12 and iterations 334, 336, and 338 of FIG. 13. Note that FIGS. 10–13 illustrate an example having only two unfolded P transistors and two unfolded N transistors. However, the methods of FIGS. 6–8 apply to any number of transistors, possible fold solutions, and any complexity of dependency map 310. For example, any edge in dependency map 310, as described above, may be a hyper edge which couples any number of nodes together. Also, FIGS. 11–13 may not illustrate every possible iteration, but illustrate a subset sufficient to provide an example.

Figure 9:
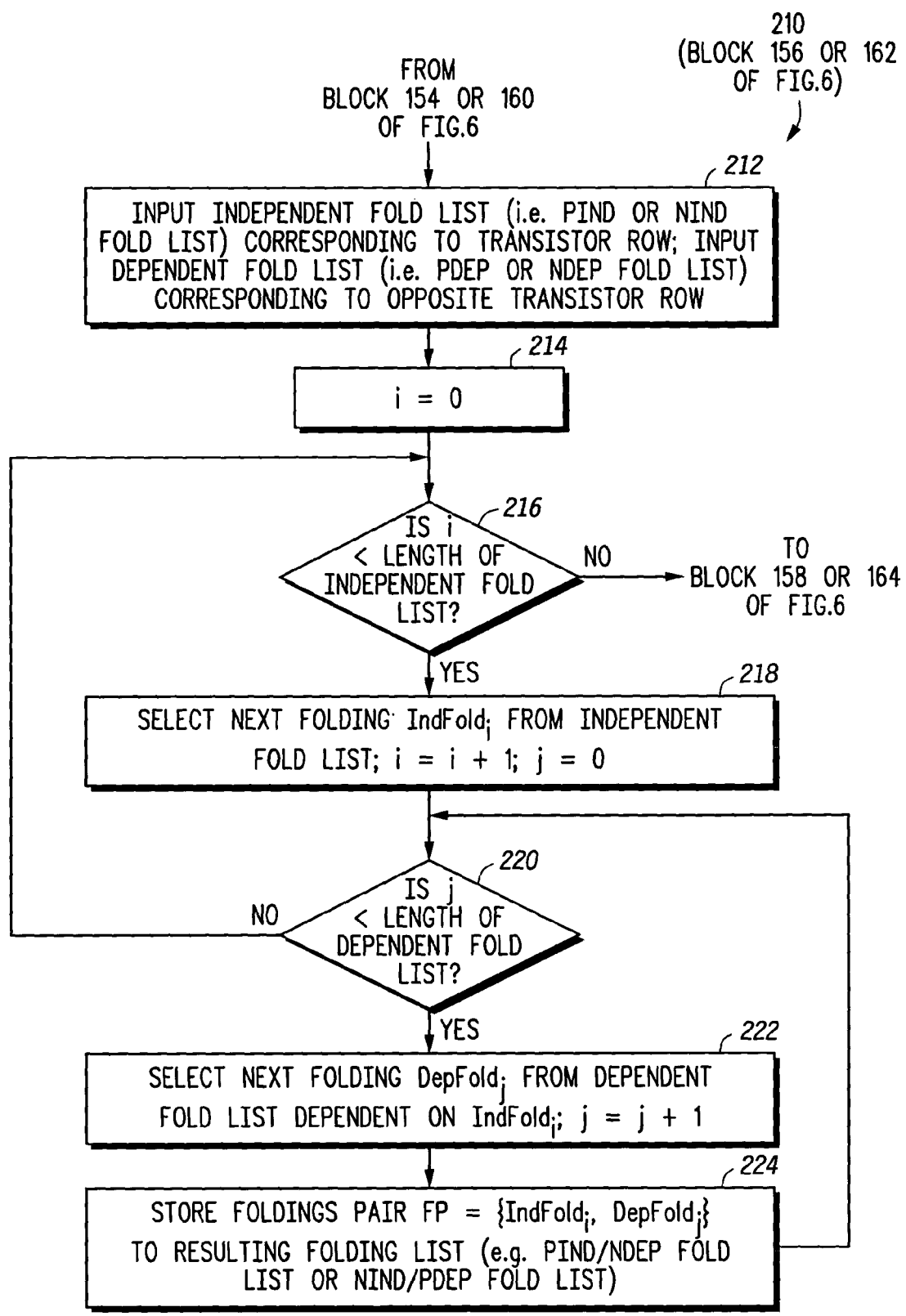
FIG. 9 illustrates a method of creating an independent/dependent folding list in accordance with one embodiment of the present invention.

FIG. 9 illustrates a flow 210 of block 156 or 162 of FIG. 6. That is, flow 210 illustrates one embodiment of a method to combine an independent fold list and a dependent fold list. Therefore, for block 156 of FIG. 6, flow 210 is used to combine PIND fold list and NDEP fold list into a PIND/NDEP fold list, and for block 162, flow 210 is used to combine NIND fold list and PDEP fold list into a NIND/PDEP fold list. Note that flow 210 will be described in reference to block 156 for ease of understanding. Flow begins with block 212 where an independent fold list (PIND fold list, in the current example) corresponding to a transistor row (P, in the current example) is input, and a dependent fold list (NDEP fold list, in the current example) corresponding to the opposite transistor row (N, in the current example). Flow proceeds to block 214 where the counter value i is initialized to 0. Flow proceeds to decision diamond 216 where it is determined whether i is less than the length of the independent fold list. If so, in block 218, a next folding IndFold$_i$ is selected from the independent fold list, and i is increased by one, and another counter value j is initialized to 0. Flow proceeds to decision diamond 220. If i is not less than the length of the independent fold list at decision diamond 216, flow proceeds to block 158 or 164 of FIG. 6.

At decision diamond 220, it is determined whether j is less than the length of the dependent fold list. If not, flow returns to decision diamond 216 where it is determined if more fold solutions exist in the independent fold list. However, if j is less than the length of the dependent fold list, flow proceeds to block 222 where a next folding DepFold$_j$ is selected from the dependent fold list which is dependent on IndFold$_i$. The counter value j is also increased by one. Flow then proceeds to block 224 where the fold solution pair FP={IndFold$_i$, DepFold$_j$} is stored to the resulting fold solution list (PIND/NDEP fold list or NIND/PDEP fold list). Note that in the current example, PIND/NDEP fold list is the resulting fold solution list. Flow then returns to decision diamond 220 where it is determined if any more fold solutions exist in the dependent fold list.

At decision diamond 216, if no more fold solutions exist in the independent fold list, flow 210 is complete, indicating that all independent fold solutions (and their corresponding dependent solutions) have been processed and stored, and flow proceeds to block 158 or 164 of FIG. 6. In block 164 of FIG. 6, PIND/NDEP fold list (created in block 156) and NIND/PNEP fold list (created in block 162) are merged to create the initial fold solution list (indicated in block 106 of FIG. 3). Therefore, flow proceeds with block 108 of FIG. 3, as was described above.

Note that in the example of FIGS. 10–13, and assuming a target cell height of 17, the narrowest folding solution is provided by iteration 336 of FIG. 13. That is, iteration 336 meets the target cell height, as do the other iterations, however, it provides the narrowest solution. Therefore, the finger-based enumeration method of FIG. 6 provided for an optimized cell layout that can ultimately be determined in the flow of FIG. 3 where each of the solutions (corresponding to the iterations) is processed to determine the best width while meeting the cell height constraint.

As an extension to the finger-based folding enumeration of FIG. 6, unequal foldings may be used that consider the special configuration available for parallel transistors. That is, folded fingers of different parallel transistors can be adjusted in size so that these smaller fingers can be vertically stacked. This will reduce the total number of fingers placed horizontally, thus reducing the cell width. For parallel transistors, both stacked fingers can share diffusion with both neighboring transistors, thus not creating any new diffusion breaks.

Figure 14:
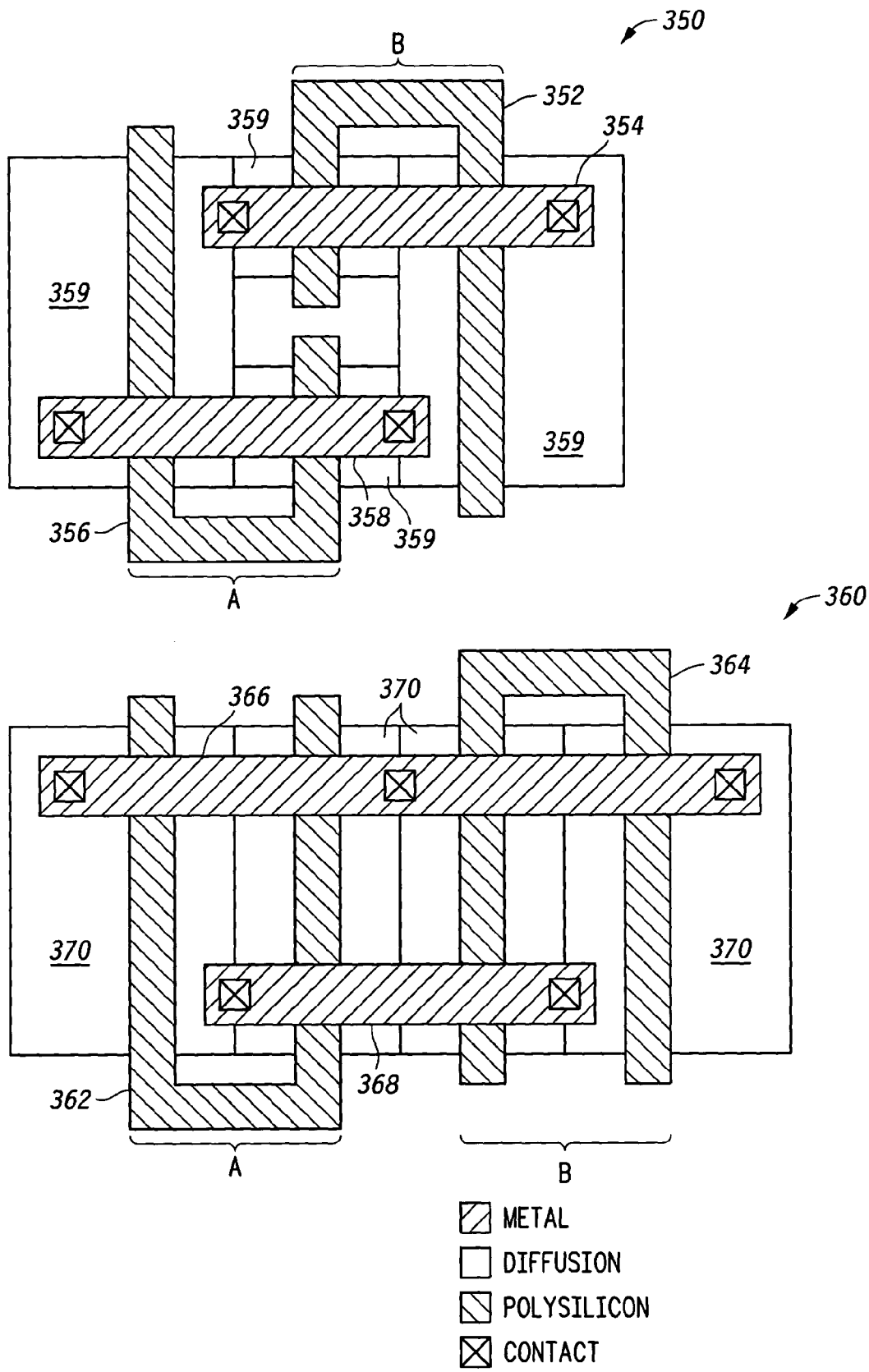
FIG. 14 illustrates a transistor folding in accordance with another embodiment of the present invention.

The basic idea can be illustrated with a two input NAND gate, whose P transistors are in parallel. If the P transistors have a width of 20 each, then under equal folding conditions, both transistors have a single finger of width 20. The next iteration (as described in reference to FIG. 6) results in a 3 finger solution with one transistor of width 20, and the other with two fingers, of width 10. A subsequent iteration results in a 4 finger solution as illustrated with solution 360 of FIG. 14 where transistor A includes two fingers corresponding to the overlap of polysilicon 362 with diffusion region 370. (Note that metal contacts are provided by metal regions 366 and 368.) However, the parallel transistors can be considered as a joined transistor with a width of 40 (20+20) for the purposes of fold enumeration, so that the valid foldings are divisions of 40 into equal sized subfingers, thus yielding 20, $^{40}/_3$=13.3, 10, $^{40}/_5$=8, etc. as widths for the number of fingers corresponding to 2, 3, 4, 5, etc. That is, for 2 fingers, the width is 20, for 3, the width is 13.3, etc. Thus, a solution having a 13.3. width can be constructed using unequal folds, as illustrate with solution 350 of FIG. 14. Each transistor, A and B in FIG. 14, has two fingers, one of size 13.3, and the other of size 6.7. The smaller fingers of A and B can therefore be vertically stacked such that the resulting width of solution 350 is narrower than the solution of 360. Note that in solution 350, there are no diffusion breaks within diffusion regions 359, and that each transistor is formed by the unequal lengths of the polysilicon regions 356 and 352. For example, transistor A corresponds to the overlapping of polysilicon region 356 over diffusion region 359, and transistor B corresponds to the overlapping of polysilicon region 352 over diffusion regions 359.

Parallel transistors may be considered together in fold enumeration through the following operation. Parallel transistors with widths of W1, W2, . . . Wn define a virtual merged transistor which has width Tw=W1+W2+ . . . Wn. Folds are enumerated such that each subsequent enumeration adds a single finger to the merged transistor set. For each fold of size k, fingers having transistor width of approximately Tw/k are defined. The individual fingers of size Tw/k are constructed from original transistors until the full transistor width is consumed or until there is a partial remainder left on a transistor. Partial finger sizes of less than Tw/k are shared between multiple real transistors by stacking partial fingers physically, with adjustment of shared finger sizes for layout rules. In a case where there are two parallel transistors treated together in this merged fashion, an even number of fingers in the merged enumeration results in parallel transistors with separate fingers, and an odd number of fingers in the merged enumeration yields a single finger that is shared between two transistors and remaining fingers that are separate fingers of the individual parallel transistors. The latter case is not a possible enumeration through most other currently known techniques and is physically implemented as illustrated with solution 350 of FIG. 14.

Therefore, additional enumerations can be stored into the independent fold list in the flow of FIG. 7 by considering parallel transistors separately, and as an alternate solution, considering them together in creating subsequent folds.

Figure 15:
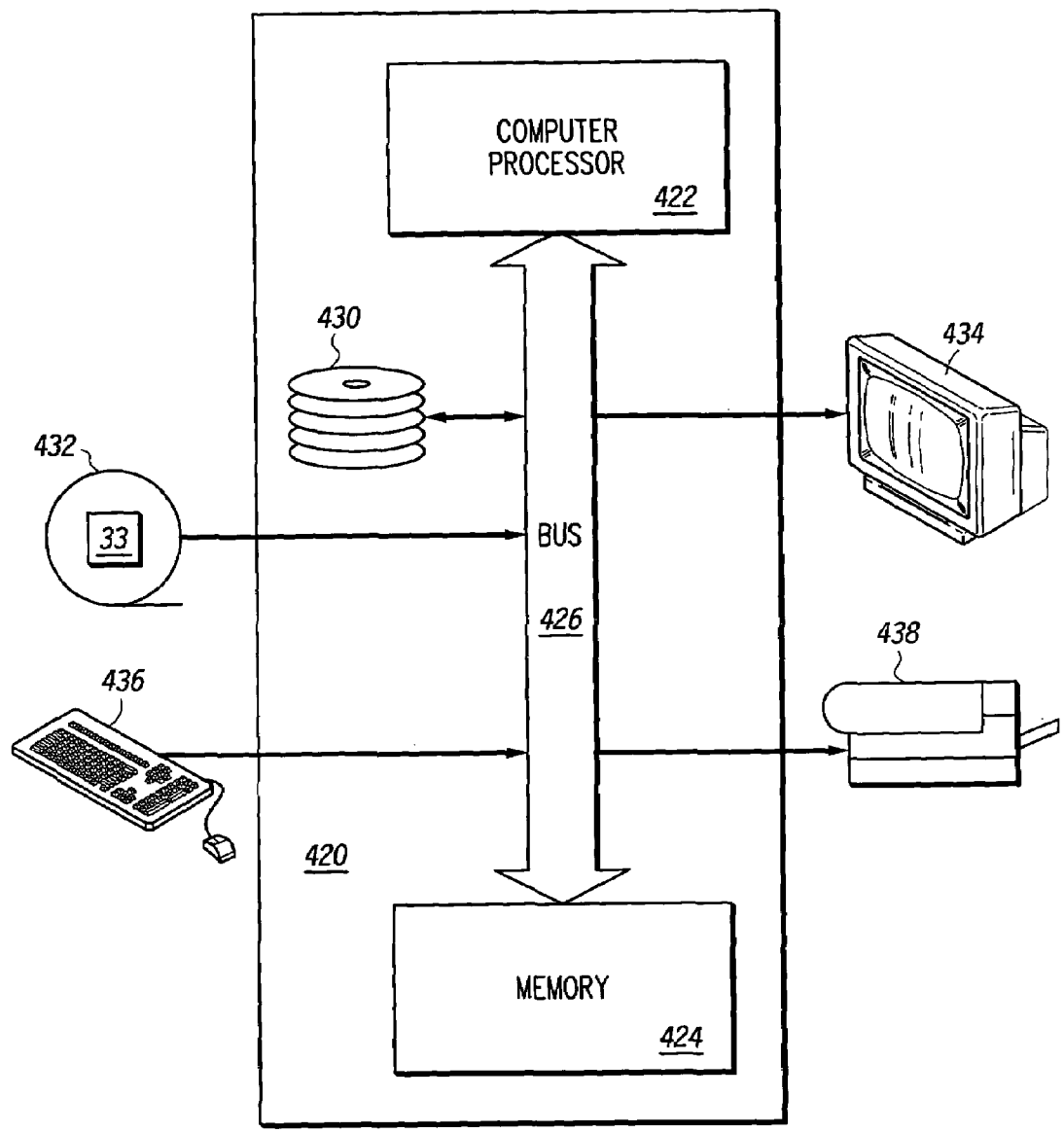
FIG. 15 illustrates, in block diagram form, a computer system in accordance with one embodiment of the present invention.

FIG. 15 illustrates, in block diagram form, a general purpose computer 420 in accordance with one embodiment of the present invention which may be used to execute the methods discussed herein. General purpose computer 420 includes a computer processor 422 and memory 424 coupled by a bus 426. Memory 424 may include relatively high speed machine readable media such as DRAM, SRAM, ROM, FLASH, EEPROM, bubble memory, etc. Also coupled to bus 426 are secondary storage 430, external storage 432, output devices such as a monitor 434, input devices such as a keyboard (with mouse) 436, and printers 438. Secondary storage 430 may include machine readable media such as hard disk drives, magnetic drum, bubble memory, etc. External storage 432 may include machine readable media such as floppy disks, removable hard drives, magnetic tap, CD-ROM, and even other computers, possibly connected via a communications line. It should be appreciated that there may be overlap between some elements, such as between secondary storage 430 and external storage 432. Executable versions of computer software 433, such as, for example, software for performing the transistor folding and cell layout generation described herein, can be written to, and later read from external storage 432, loaded for execution directly into memory 424, or stored on secondary storage 430 prior to loading into memory 424 and execution. Also, the transistor netlist may be stored in secondary storage 430 or external storage 432.

Although the invention has been described with respect to specific conductivity types or polarity of potentials, skilled artisans appreciated that conductivity types and polarities of potentials may be reversed.

In the foregoing specification, the invention has been described with reference to specific embodiments. However, one of ordinary skill in the art appreciates that various modifications and changes can be made without departing from the scope of the present invention as set forth in the claims below. For example, any software taught herein may be embodied on one or more of computer hard disks, floppy disks, 3.5" disks, computer storage tapes, magnetic drums, static random access memory (SRAM) cells, dynamic random access memory (DRAM) cells, electrically erasable (EEPROM, EPROM, flash) cells, nonvolatile cells, ferroelectric or ferromagnetic memory, compact disks (CDs), laser disks, optical disks, and any like computer readable media. Also, the block diagrams may different blocks than those illustrated and may have more or less blocks or be arranged differently. Also, the flow diagrams may also be arranged differently, include more or less steps, be arranged differently, or may have steps that can be separated into multiple steps or steps that can be performed simultaneously with one another. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method for generating an integrated circuit layout, comprising the steps of:
   receiving an integrated circuit netlist describing a plurality of transistors and a plurality of conductors for interconnecting the plurality of transistors, each of the plurality of transistors having a width in a layout corresponding to the integrated circuit netlist;
   determining that more than one of the plurality of transistors are the widest transistors and that the more than one widest transistors all have the same width;
   folding only one of the widest transistors to produce a folded transistor that is electrically equivalent to the widest transistor, the folded transistor having at least two fingers, each finger having a smaller width than the width of the widest transistors;
   creating a fold solution for the layout with the one folded transistor,
   wherein the steps of folding and creating are repeated for each of the plurality of transistors until all of the plurality of transistors have been folded at least once;
   wherein the plurality of transistors includes a plurality of N-channel transistors and a plurality of P-channel transistors and the steps of folding and creating are repeated for each transistor of the plurality of N-channel transistors to create an independent N-channel fold solution list and the steps of folding and creating are repeated for each transistor of the plurality of P-channel transistors to create an independent P-channel fold solution list;
   the method further comprising the steps of:
   receiving a dependency map for listing dependent pairs of N-channel and P-channel transistors from the integrated circuit netlist;
   summing the widths of the dependent pairs to generate a height lower bound;
   folding transistors of the dependent pairs having a height lower bound greater than a predetermined amount to produce an N-channel dependent fold list and a P-channel dependent fold list; and
   merging the independent N-channel fold solution list, the independent P-channel fold solution list, the N-channel dependent fold list and the P-channel dependent fold list to produce an initial fold solution list.

2. The method of claim 1, further comprising the step of selecting a fold solution from the initial fold solution list.

3. The method of claim 2 further comprising the step of create modified fold solution from the selected fold solution based on predetermined cell layout information.

4. The method of claim 3 further comprising the steps of:
   placing transistors from the modified fold solution list in the integrated circuit layout;
   defining a routing channel between the plurality of P-channel transistors and the plurality of N-channel transistors;
   calculating a predetermined metric for the modified fold solution; and
   generating the integrated circuit layout.

5. The method of claim 4, wherein the method is implemented as software on a data processing system.

6. A method for generating an integrated circuit layout comprising the steps of:
   receiving an integrated circuit netlist describing a plurality of P-channel transistors, a plurality of N-channel transistors, and a plurality of conductors for interconnecting the plurality of N-channel transistors and the plurality of P-channel transistors, each of the transistors having a width in a layout corresponding to the integrated circuit netlist;
   folding the widest transistors of the plurality of N-channel transistors and the plurality of P-channel transistors to produce a list of folded N-channel transistors and a list of folded P-channel transistors, each folded transistor having at least two fingers, each finger having a smaller width than the width of its corresponding unfolded transistor, and each folded transistor being electrically equivalent to its corresponding unfolded transistor;
   receiving a dependency map for listing dependent pairs of N-channel and P-channel transistors from the integrated circuit netlist;
   summing the widths of the dependent pairs to generate a height lower bound;
   folding transistors of the dependent pairs having a height lower bound greater than a predetermined amount to produce an N-channel dependent fold list and a P-channel dependent fold list; and
   merging the list of folded N-channel transistors, the list of folded P-channel transistors, the N-channel dependent fold list and the P-channel dependent fold list to produce an initial fold solution list.

7. The method of claim 6, wherein a fold solution from the initial fold solution list is selected based on a predetermined selection criteria.

8. The method of claim 7 further comprising the step of creating a modified fold solution from the selected fold solution based on predetermined cell layout information.

9. The method of claim 8 further comprising the steps of:
placing transistors from the modified fold solution in the integrated circuit layout;
defining a routing channel between the plurality of P-channel transistors and the plurality of N-channel transistors;
calculating a predetermined metric for the modified fold solution; and
generating the integrated circuit layout.

10. The method of claim 9, wherein the method is implemented as software on a data processing system.

11. A method for generating an integrated circuit layout comprising the steps of:
receiving a base logical cell structure describing a plurality of transistors and a plurality of conductors for interconnecting the plurality of transistors, each of the transistors having a width in a layout corresponding to the base logical cell structure;
iteratively folding only one transistor at a time of the plurality of transistors that have a width greater than a predetermined width to produce two transistors, each of the two transistors having a width shorter than the width of a corresponding unfolded transistor;
after each iteration, creating a fold solution after each iteration and adding the fold solution to a fold solution list;
wherein the base logical cell structure is a portion of an integrated circuit netlist for defining an integrated circuit;
the method further comprising the steps of:
determining that more than one of the plurality of transistors are the widest transistors and that the more than one widest transistors all have the same width;
folding only one of the widest transistors to produce a folded transistor that is electrically equivalent to the widest transistor, the folded transistor having at least two fingers, each finger having a smaller width than the width of the widest transistors;
creating a fold solution for the layout with the one folded transistor
wherein the steps of folding and creating are repeated for each of the plurality of transistors until all of the plurality of transistors have been folded at least once, and wherein the plurality of transistors includes a plurality of N-channel transistors and a plurality of P-channel transistors and the steps of folding and creating are repeated for each transistor of the plurality of N-channel transistors to create an independent N-channel fold solution list and the steps of folding and creating are repeated for each transistor of the plurality of P-channel transistors to create an independent P-channel fold solution list;
the method further comprising the steps of:
receiving a dependency map for listing dependent pairs of N-channel and P-channel transistors from the integrated circuit netlist;
summing the widths of the dependent pairs to generate a height lower bound;
folding transistors of the dependent pairs having a height lower bound greater than a predetermined amount to produce an N-channel dependent fold list and a P-channel dependent fold list; and
merging the independent N-channel fold solution list, the independent P-channel fold solution list, the N-channel dependent fold list and the P-channel dependent fold list to produce an initial fold solution list.

12. The method of claim 11, further comprising the step of selecting a fold solution from the initial fold solution list.

13. The method of claim 12, further comprising the step of creating a modified fold solution from the selected fold solution based on predetermined cell layout information.

14. The method of claim 13, further comprising the steps of:
placing transistors from the modified fold solution list in the integrated circuit layout;
defining a routing channel between the plurality of P-channel transistors and the plurality of N-channel transistors;
calculating a predetermined metric for the modified fold solution; and
generating the integrated circuit layout.

15. A method for generating an integrated circuit layout comprising the steps of:
receiving a base logical cell structure describing a plurality of P-channel transistors, a plurality of N-channel transistors, and a plurality of conductors for interconnecting the plurality of N-channel transistors and the plurality of P-channel transistors, each of the transistors having a width in a layout corresponding to the base logical cell structure;
receiving a dependency map for listing dependent pairs of N-channel and P-channel transistors from the base logical cell structure; and
folding transistors of the plurality of N-channel transistors and the plurality of P-channel transistors based on a predetermined parameter of the dependency map, wherein the step of folding a transistor produces two transistors, each of the two transistors having a width shorter than the width of a corresponding unfolded transistor, wherein the plurality of N-channel transistors and the plurality of P-channel transistors are iteratively folded to an N-channel dependent fold list and a P-channel dependent fold list, wherein the predetermined parameter of the dependency map is a height lower bound determined by summing transistor widths of each of the dependent pairs;
folding the widest transistors of the plurality of N-channel transistors and the plurality of P-channel transistors to produce a list of folded N-channel transistors and a list of folded P-channel transistors, wherein the list of folded N-channel transistors and the list of folded P-channel transistors are produced independent of the dependency map; and
merging the list of folded N-channel transistors, the list of folded P-channel transistors, the N-channel dependent fold list and the P-channel dependent fold list to produce an initial fold solution list.

16. The method of claim 15, further comprising the step of selecting a fold solution from the initial fold solution list.

17. The method of claim 16 further comprising the step of create modified fold solution from the selected fold solution based on predetermined cell layout information.

* * * * *

UNITED STATES PATENT AND TRADEMARK OFFICE
CERTIFICATE OF CORRECTION

PATENT NO. : 7,124,385 B2  Page 1 of 1
APPLICATION NO. : 10/657609
DATED : October 17, 2006
INVENTOR(S) : Patrick J. McGuinness It is certified that error appears in the above-identified patent and that said Letters Patent is hereby corrected as shown below:

In Column 20, Line 18, Claim No. 3:

Change "create modified fold solution from" to --creating modified fold solution from--

In Column 22, Line 59, Claim No. 17:

Change "create modified fold solution from" to --creating modified fold solution from--

Signed and Sealed this

Twenty-second Day of July, 2008

JON W. DUDAS
*Director of the United States Patent and Trademark Office*